US011342461B2

(12) United States Patent
Saitoh et al.

(10) Patent No.: US 11,342,461 B2
(45) Date of Patent: May 24, 2022

(54) THIN FILM TRANSISTOR, METHOD FOR PRODUCING SAME AND DISPLAY DEVICE

(71) Applicant: SHARP KABUSHIKI KAISHA, Sakai (JP)

(72) Inventors: Takao Saitoh, Sakai (JP); Yohsuke Kanzaki, Sakai (JP); Seiji Kaneko, Sakai (JP); Masahiko Miwa, Sakai (JP); Masaki Yamanaka, Sakai (JP); Yi Sun, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 16/978,584

(22) PCT Filed: Mar. 7, 2018

(86) PCT No.: PCT/JP2018/008805
§ 371 (c)(1),
(2) Date: Sep. 4, 2020

(87) PCT Pub. No.: WO2019/171505
PCT Pub. Date: Sep. 12, 2019

(65) Prior Publication Data
US 2021/0028314 A1     Jan. 28, 2021

(51) Int. Cl.
*H01L 27/00*     (2006.01)
*H01L 29/00*     (2006.01)
(Continued)

(52) U.S. Cl.
CPC .. *H01L 29/78621* (2013.01); *H01L 29/66969* (2013.01); *H01L 21/383* (2013.01); *H01L 27/1225* (2013.01); *H01L 27/3244* (2013.01); *H01L 29/7869* (2013.01); *H01L 29/78693* (2013.01)

(58) Field of Classification Search
CPC ............. H01L 21/383; H01L 21/02565; H01L 21/02554; H01L 21/02274; H01L 27/3244; H01L 27/1225; H01L 27/124; H01L 27/1214; H01L 29/78621; H01L 29/66969; H01L 29/78693; H01L 29/7869
See application file for complete search history.

(56) References Cited

U.S. PATENT DOCUMENTS 5,561,075 A    10/1996   Nakazawa
5,926,735 A *   7/1999   Yamazaki ......... H01L 21/28079
                                                                    438/635

(Continued)

FOREIGN PATENT DOCUMENTS

JP     H05-166837 A    7/1993
JP     2008-176262 A    7/2008
(Continued)

*Primary Examiner* — Nikolay K Yushin
(74) *Attorney, Agent, or Firm* — ScienBiziP, P.C.

(57) ABSTRACT

A TFT includes an oxide semiconductor layer including a conductive region electrically connected to a source electrode, a conductive region electrically connected to a drain electrode, a channel region being an oxide semiconductor region that overlaps a gate electrode, and at least one resistive region being an oxide semiconductor region provided between the channel region and a conductive region adjacent to the channel region.

20 Claims, 28 Drawing Sheets

(51) Int. Cl.
H01L 29/786 (2006.01)
H01L 29/66 (2006.01)
H01L 21/383 (2006.01)
H01L 27/12 (2006.01)
H01L 27/32 (2006.01)

(56) References Cited

U.S. PATENT DOCUMENTS

| | | | |
|---|---|---|---|
| 6,037,197 A * | 3/2000 | Yamazaki | G02F 1/133553 |
| | | | 438/151 |
| 8,384,076 B2 * | 2/2013 | Park | H01L 29/66969 |
| | | | 257/43 |
| 9,911,762 B2 * | 3/2018 | Yan | H01L 29/78648 |
| 2007/0215945 A1 | 9/2007 | Tokunaga et al. | |
| 2009/0283763 A1 * | 11/2009 | Park | H01L 29/66969 |
| | | | 257/43 |
| 2013/0175522 A1 | 7/2013 | Shimayama et al. | |
| 2015/0221679 A1 | 8/2015 | Yamazaki et al. | |
| 2016/0149047 A1 | 5/2016 | Watakabe et al. | |
| 2017/0104018 A1 | 4/2017 | Yamazaki et al. | |
| 2017/0162606 A1 * | 6/2017 | Yan | H01L 29/78648 |
| 2017/0287999 A1 | 10/2017 | Kimura et al. | |
| 2020/0185527 A1 | 6/2020 | Miyamoto | |

FOREIGN PATENT DOCUMENTS

| | | |
|---|---|---|
| JP | 2013-165108 A | 8/2013 |
| JP | 2015-181150 A | 10/2015 |
| JP | 2016-100521 A | 5/2016 |
| JP | 2017-076785 A | 4/2017 |
| JP | 2017-188508 A | 10/2017 |
| WO | 2017/188106 A1 | 11/2017 |

* cited by examiner

THIN FILM TRANSISTOR, METHOD FOR PRODUCING SAME AND DISPLAY DEVICE

TECHNICAL FIELD

The disclosure relates to a thin film transistor having a gentle rise of a drive voltage in a current-voltage characteristic, a manufacturing method of the thin film transistor, and a display device.

BACKGROUND ART

PTL 1 discloses a thin film transistor (TFT) in which a source region and a drain region being tow-resistive regions are formed with a channel region interposed therebetween.

In PTL 1, for example, a gate insulating film that functions as a hydrogen blocking layer and is formed of a silicon oxide film or the like, and a gate electrode are sequentially film-formed on an InGaZnO based oxide semiconductor layer formed in an island shape, and the hydrogen blocking layer and the gate insulating film are collectively patterned. Subsequently, an interlayer insulating film formed of a silicon nitride film is film-formed on the gate insulating film and the gate electrode by a plasma chemical vapor deposition (CVD) method in which a gas containing hydrogen is introduced. In this way, a region of an oxide semiconductor layer other than the channel region is made low-resistive.

CITATION LIST

Patent Literature

PTL 1: JP 2016-100521 A (published on May 30, 2016)

SUMMARY

Technical Problem

However, the TFT in which the low-resistive regions are formed adjacent to the channel region in such a manner has a steep rise (subthreshold slope) of a drive voltage in a current-voltage characteristic. Thus, such a TFT has a great amount of change in current when a voltage is changed, and is unsuitable for a display device that performs current driving such as an organic electroluminescence (EL) display device.

Thus, an object of an aspect of the disclosure is to provide a thin film transistor having a gentler rise of a drive voltage in a current-voltage characteristic than that in a known manner, a manufacturing method of the thin film transistor, and a display device.

Solution to Problem

In order to solve the problem described above, a thin film transistor according to an aspect of the disclosure includes: at least one gate electrode; an oxide semiconductor layer located below the at least one gate electrode; at least one gate insulating film provided between the oxide semiconductor layer and the at least one gate electrode; and a source electrode and a drain electrode separated from each other with the at least one gate electrode interposed between the source electrode and the drain electrode in a plan view, where at least one of the source electrode and the drain electrode is provided above the gate insulating film, the oxide semiconductor layer includes an oxide semiconductor region, and a plurality of conductive regions including a conductive region electrically connected to the source electrode and a conductive region electrically connected to the drain electrode, and the oxide semiconductor region includes at least one channel region overlapping the at least one gate electrode, and at least one resistive region provided between the at least one channel region and a conductive region adjacent to the channel region, the at least one resistive region having a resistance higher than a resistance of the conductive region.

In order to solve the problem described above, a display device according to an aspect of the disclosure includes the thin film transistor according to an aspect of the disclosure.

In order to solve the problem described above, a manufacturing method of a thin film transistor according to an aspect of the disclosure including: at least one gate electrode; an oxide semiconductor layer located below the at least one gate electrode; at least one gate insulating film provided between the oxide semiconductor layer and the at least one gate electrode; and a source electrode and a drain electrode separated from each other with the at least one gate electrode interposed between the source electrode and the drain electrode in a plan view, at least one of the source electrode and the drain electrode being provided above the gate insulating film, the oxide semiconductor layer including an oxide semiconductor region, at least one channel region overlapping the at least one gate electrode, a plurality of conductive regions including a conductive region electrically connected to the source electrode and a conductive region electrically connected to the drain electrode, and at least one resistive region provided between the at least one channel region and a conductive region adjacent to the channel region, the at least one resistive region having a resistance higher than a resistance of the conductive region is the manufacturing method that includes: forming the oxide semiconductor layer; forming the at least one gate insulating film on the oxide semiconductor layer; forming the at least one gate electrode on the at least one gate insulating film; forming a hydrogen blocking layer that covers the at least one channel region and the at least one resistive region in the oxide semiconductor layer; irradiating the oxide semiconductor layer with hydrogen plasma from above the hydrogen blocking layer, and then removing the hydrogen blocking layer; and forming an interlayer insulating film formed of a silicon oxide film, the interlayer insulating film covering the oxide semiconductor layer, the at least one gate insulating film, and the at least one gate electrode.

In order to solve the problem described above, a manufacturing method of a thin film transistor according to an aspect of the disclosure including: at least one gate electrode; an oxide semiconductor layer located below the at least one gate electrode; at least one gate insulating film provided between the oxide semiconductor layer and the at least one gate electrode; and a source electrode and a drain electrode separated from each other with the at least one gate electrode interposed between the source electrode and the drain electrode in a plan view, at least one of the source electrode and the drain electrode being provided above the gate insulating film, the oxide semiconductor layer including an oxide semiconductor region, at least one channel region overlapping the at least one gate electrode, a plurality of conductive regions including a conductive region electrically connected to the source electrode and a conductive region electrically connected to the drain electrode, and at least one resistive region provided between the at least one channel region and a conductive region adjacent to the channel region, the at least one resistive region having a resistance higher than a resistance of the conductive region is the manufacturing method that includes: forming the oxide semiconductor layer; forming the at least one gate insulating film in an island shape on the oxide semiconductor layer, a portion of the at least one gate insulating film that overlaps the oxide semiconductor layer being smaller than the oxide semiconductor layer and larger than the gate electrode; forming the at least one gate electrode on the at least one gate insulating film; and forming an interlayer insulating film formed of a silicon nitride film, the interlayer insulating film covering the oxide semiconductor layer, the at least one gate insulating film, and the at least one gate electrode.

Advantageous Effects of Disclosure

According to an aspect of the disclosure, it is possible to provide a thin film transistor having a gentler rise of a drive voltage in a current-voltage characteristic than that in a known manner, a manufacturing method of the thin film transistor, and a display device.

DESCRIPTION OF EMBODIMENTS

First Embodiment

Figure 1:
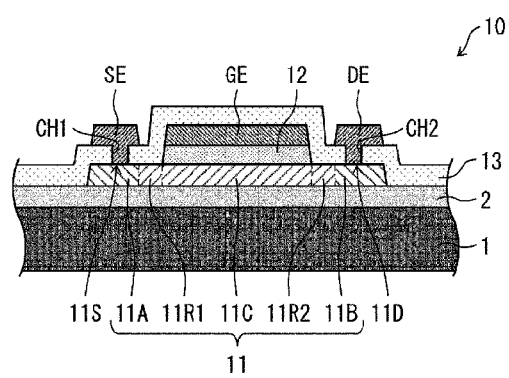
FIG. 1 is a cross-sectional view illustrating a schematic configuration of a TFT according to a first embodiment of the disclosure.
Figure 2:
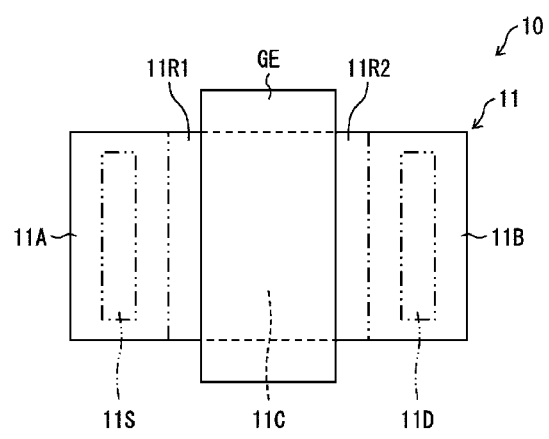
FIG. 2 is a plan view illustrating a schematic configuration of main portions of the TFT according to the first embodiment of the disclosure.

One embodiment of the disclosure will be described below with reference to FIGS. 1 to 6.
Schematic Configuration of TFT FIG. 1 is a cross-sectional view illustrating a schematic configuration of a thin film transistor (TFT) 10 according to the present embodiment. FIG. 2 is a plan view illustrating a schematic configuration of main portions of the thin film transistor (TFT) 10 according to the present embodiment. Note that FIG. 2 illustrates only an oxide semiconductor layer 11 and a gate electrode GE in the TFT 10 described above. In the following description, a "lower layer" refers to a layer formed in a process before the layer being compared, and an "upper layer" refers to a layer formed in a process after the layer being compared.

As illustrated in FIG. 1, the TFT 10 according to the present embodiment is a top gate type transistor. The TFT 10 is formed on a support body 1 having insulating properties. The support body 1 may be, for example, a glass substrate or a plastic substrate, and may be, for example, a plastic film such as a layered film in which a resin layer is formed on a lower face film. Examples of a material of the resin layer or the plastic substrate include a polyimide and the like. Examples of a material of the lower face film include polyethylene terephthalate (PET) and the like. An inorganic insulating film 2 may be formed on the support body 1 as a base coat layer (underlayer) for preventing diffusion of impurities from the support body 1, and the TFT 10 may be formed on the inorganic insulating film 2 formed on the support body 1. Hereinafter, a case in which the TFT 10 is formed on the inorganic insulating film 2 will be described as an example.

The TFT 10 includes the oxide semiconductor layer 11, an inorganic insulating film 12 (gate insulating film) that is an upper layer overlying the oxide semiconductor layer 11, the gate electrode GE that is an upper layer overlying the inorganic insulating film 12, an inorganic insulating film 13 that is an upper layer overlying the gate electrode GE, and a source electrode SE and a drain electrode DE that are an upper layer overlying the inorganic insulating film 13.

The oxide semiconductor layer 11 is formed on the inorganic insulating film 2. The inorganic insulating film 2 covers the surface of the support body 1. The inorganic insulating film 2 is formed of an inorganic insulating film containing Si (silicon), such as $SiO_2$ (silicon oxide), SiNx (silicon nitride), and SiNO (silicon oxynitride), for example. The support body 1 may be, for example, a glass substrate or a plastic substrate, and may be, for example, a plastic film such as a layered film in which a resin layer is formed on a lower face film. Examples of a material of the resin layer and the plastic substrate include a polyimide. Examples of a material of the lower face film include polyethylene terephthalate (PET) and the like.

An oxide semiconductor included in the oxide semiconductor layer 11 may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to a layer surface.

The oxide semiconductor layer 11 may have a layered structure of two or more layers. When the oxide semiconductor layer 11 has a layered structure, the oxide semiconductor layer 11 may include an amorphous oxide semiconductor layer and a crystalline oxide semiconductor layer, and may include a plurality of crystalline oxide semiconductor layers having different crystal structures. The oxide semiconductor layer 11 may include a plurality of amorphous oxide semiconductor layers.

Materials, structures, and film formation methods of the amorphous oxide semiconductor and each of the crystalline oxide semiconductors, a configuration of the oxide semiconductor layer 11 having the layered structure, and the like are described in JP 2014-007399 A, for example. The entire contents of the disclosure of JP 2014-007399 A are incorporated herein as reference.

The oxide semiconductor layer 11 may contain, for example, a metal element of at least one kind from In (indium), Ga (gallium), and Zn (zinc). In the present embodiment, the oxide semiconductor layer 11 includes, for example, an In—Ga—Zn—O based semiconductor (for example, an indium gallium zinc oxide). Here, the In—Ga—Zn—O based semiconductor is a ternary oxide of in, Ga, and Zn, and a ratio (composition ratio) of In, Ga, and Zn is not particularly limited. For example, the ratio includes In:Ga:Zn=2:2:1, In:Ga:Zn=1:1:1, or In:Ga:Zn=1:1:2, or the like. Such an oxide semiconductor layer 11 can be formed of an oxide semiconductor film including the In—Ga—Zn—O based semiconductor.

The In—Ga—Zn—O based semiconductor may be an amorphous semiconductor or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A described above, JP 2012-134475 A, JP 2014-209727 A, and the like. The entire contents of the disclosure of JP 2012-134475 A and JP 2014-209727 A are incorporated herein as reference. A TFT including an In—Ga—Zn—O based semiconductor layer has high mobility (more than 20 times as compared to an a-Si TFT) and a low leakage current (less than 1/100-th as compared to the a-Si TFT). Thus, such a TFT can be suitably used as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer 11 may include another oxide semiconductor. For example, the oxide semiconductor layer 11 may include an In—Sn—Zn—O based semiconductor (for example, $In_2O_3$—$SnO_2$—ZnO; InSnZnO). The In—Sn—Zn—O based semiconductor is a ternary oxide of In, Sn (tin), and Zn. Alternatively, the oxide semiconductor layer 11 may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, $InGaO_3(ZnO)_5$, magnesium zinc oxide ($Mg_xZn_{1-x}O$), cadmium zinc oxide ($Cd_xZn_{1-x}O$), and the like. As the Zn—O based semiconductor, a semiconductor in an amorphous state of ZnO to which an impurity element of one kind or a plurality of kinds among a first group element, a 13-th group element, a 14-th group element, a 15-th group element, a 17-th group element, and the like is added, a polycrystalline state, or a microcrystalline state in which the amorphous state and the polycrystalline state are mixed, or a semiconductor to which no impurity element is added can be used.

As illustrated in FIGS. 1 and 2, the oxide semiconductor layer 11 includes a channel region 11C, resistive regions 11R1 and 11R2, and conductive regions 11A and 11B.

The channel region 11C is a region of the oxide semiconductor layer 11 that is not made conductive and overlaps the gate electrode GE in a region having a relatively high resistance value (oxide semiconductor region). Note that, here, a relatively high resistance value indicates a higher resistivity than that of the conductive regions 11A and 11B.

The resistive regions 11R1 and 11R2 are regions of the oxide semiconductor layer 11 that are not conductive as regions and do not overlap the gate electrode GE in the above-described region having a relatively high resistance value (oxide semiconductor region). The resistive regions 11R1 and 11R2 are each provided adjacent to the channel region 11C with the channel region 11C interposed therebetween.

The conductive regions 11A and 11B are low-resistive regions of the oxide semiconductor layer 11 having a resistance value lower than that of the channel region 11C and the resistive regions 11R1 and 11R2. A part of the conductive region 11A is used for a source region 11S connected to the source electrode SE. Further, a part of the conductive region 11B is used for a drain region 11D connected to the drain electrode DE. In other words, the conductive region 11A includes the source region 11S, and the conductive region 11B includes the drain region 11D. In this way, the conductive region 11A is electrically connected to a source wiring line (not illustrated), and the conductive region 11B is electrically connected to a drain wiring line (not illustrated).

The conductive region 11A is provided adjacent to the resistive region 11R1 at one of end portions of the oxide semiconductor layer 11 with the channel region 11C and the resistive regions 11R1 and 11R2 interposed therebetween. The conductive region 11B is provided adjacent to the resistive region 11R2 at the other of the end portions of the oxide semiconductor layer 11 with the channel region 11C and the resistive regions 11R1 and 11R2 interposed therebetween.

In other words, the resistive region 11R1 is provided adjacent to each of the channel region 11C and the conductive region 11A between the channel region 11C and the conductive region 11A. The resistive region 11R2 is provided adjacent to each of the channel region 11C and the conductive region 11B between the channel region 11C and the conductive region 11B. The resistive region 11R1 and the resistive region 11R2 are provided so as to be left-right symmetrical with the channel region 11C interposed therebetween. Further, the conductive region 11A and the conductive region 11B are provided so as to be left-right symmetrical with the channel region 11C interposed therebetween (more specifically, with the channel region 11C and the resistive regions 11R1 and 11R2 interposed therebetween).

A width of the resistive regions 11R1 and 11R2 is preferably equal to or greater than 1 μm, and is, for example, 1 μm to 2 μm. By setting the width of the resistive regions 11R1 and 11R2 to be equal to or greater than 1 μm, a rise (subthreshold slope) of a drive voltage in a current-voltage characteristic (Id-Vg curve) can be reliably made gentler than in a known manner.

The inorganic insulating film 12 is provided between the oxide semiconductor layer 11 located below the gate electrode GE and the gate electrode GE. In the present embodiment, the inorganic insulating film 12 is formed only on the channel region 11C in the oxide semiconductor layer 11. The inorganic insulating film 12 is not formed on the resistive regions 11R1 and 11R2 and on the conductive regions 11A and 11B, and is also not formed on the inorganic insulating film 2. Thus, the resistive regions 11R1 and 11R2 and the conductive regions 11A and 11B are not covered with the inorganic insulating film 12 and are exposed from the inorganic insulating film 12. The inorganic insulating film 12 is formed of a silicon oxide film such as $SiO_2$.

The gate electrode GE is formed on the inorganic insulating film 12, and is disposed above the channel region 11C of the oxide semiconductor layer 11 so as to face the channel region 11C. Note that the inorganic insulating film 12 is provided in contact with the oxide semiconductor layer 11, and the gate electrode GE is provided in contact with the inorganic insulating film 12. The inorganic insulating film 12 is formed in alignment with the gate electrode GE. Note that "alignment" means that the gate electrode GE and the inorganic insulating film 12 are etched by using the same mask pattern, and also includes a case in which the gate electrode GE and the inorganic insulating film 12 are slightly deviated from each other due to a difference in etching rate between the gate electrode GE and the inorganic insulating film 12.

The inorganic insulating film 13 is provided on the inorganic insulating film 2 so as to cover the oxide semiconductor layer 11, the inorganic insulating film 12, and the gate electrode GE. The inorganic insulating film 13 is formed of a silicon oxide film such as $SiO_2$.

A contact hole CH1 that extends through the inorganic insulating film 13 and reaches the conductive region 11A of the oxide semiconductor layer 11, and a contact hole CH2 that extends through the inorganic insulating film 13 and reaches the conductive region 11B of the oxide semiconductor layer 11 are formed in the inorganic insulating film 13.

The source electrode SE and the drain electrode DE are formed on the inorganic insulating film 13. The source electrode SE is electrically connected to the conductive region 11A via the contact hole CH1. The drain electrode DE is electrically connected to the conductive region 11B via the contact hole CH2. The source electrode SE and the drain electrode DE are provided so as to be separated from each other with the gate electrode GE interposed therebetween in a plan view.

Note that a connection region in the conductive region 11A with the source electrode SE is the source region 11S, and a connection region in the conductive region 11B with the drain electrode DE is the drain region 11D. Therefore, the source region 11S and the drain region 11D are provided so as to be separated from each other with the channel region 11C interposed therebetween.

The gate electrode GE, the source electrode SE, and the drain electrode DE are formed of a single layer film of metal containing, for example, at least one of aluminum (Al), tungsten (W), molybdenum (Mo), tantalum (Ta), chromium (Cr), titanium (Ti), and copper (Cu) (namely, the above-described exemplified metal or an alloy thereof) or a layered film of the metal described above. Note that the TFT 10 may be covered with a protection film (not illustrated).

The surface of the gate electrode GE and a portion of the inorganic insulating film 12 that is not covered with the gate electrode GE (specifically, side surfaces of the inorganic insulating film 12) contact the inorganic insulating film 13. In addition, a portion of the oxide semiconductor layer 11 that is not covered with any of the gate electrode GE, the source electrode SE, the drain electrode DE, and the inorganic insulating film 12 also contacts the inorganic insulating film 13. Therefore, the resistive regions 11R1 and 11R2 in the oxide semiconductor layer 11 and a region in the conductive regions 11A and 11B other than the source region 11S and the drain region 11D contact the inorganic insulating film 13.

Note that a thickness of each of the layers is not limited to a specific thickness, and may be set similarly to a known manner.

Manufacturing Method of TFT 10

Figure 3:
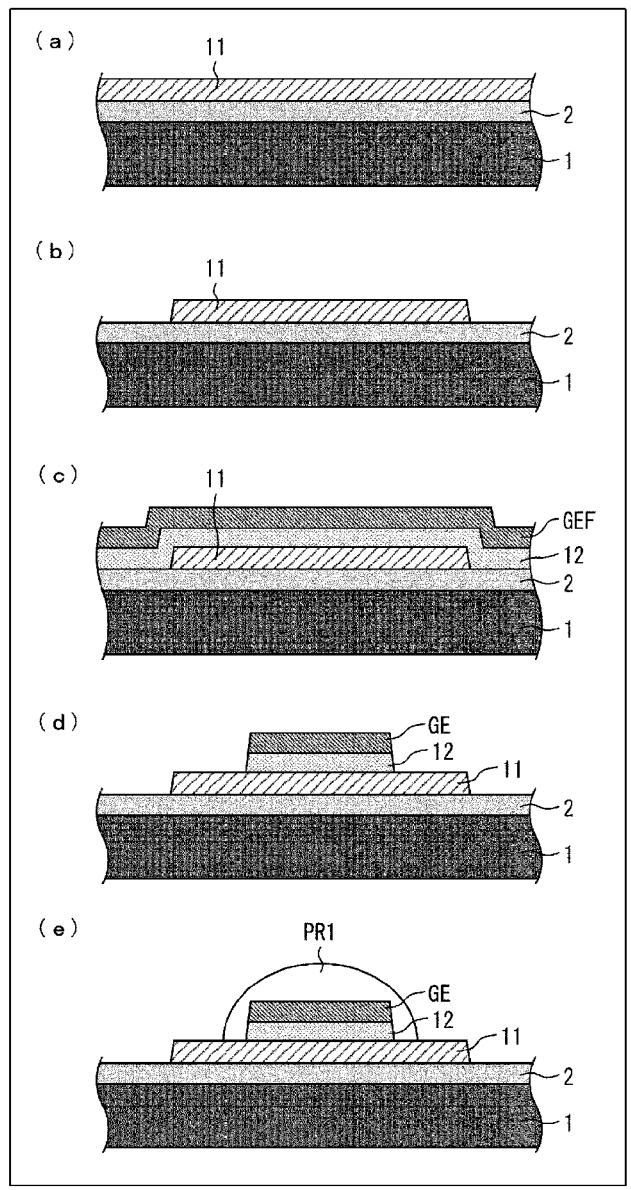
FIGS. 3(a) to 3(e) are cross-sectional views illustrating a sequence of processes for manufacturing the TFT according to the first embodiment of the disclosure.
Figure 4:
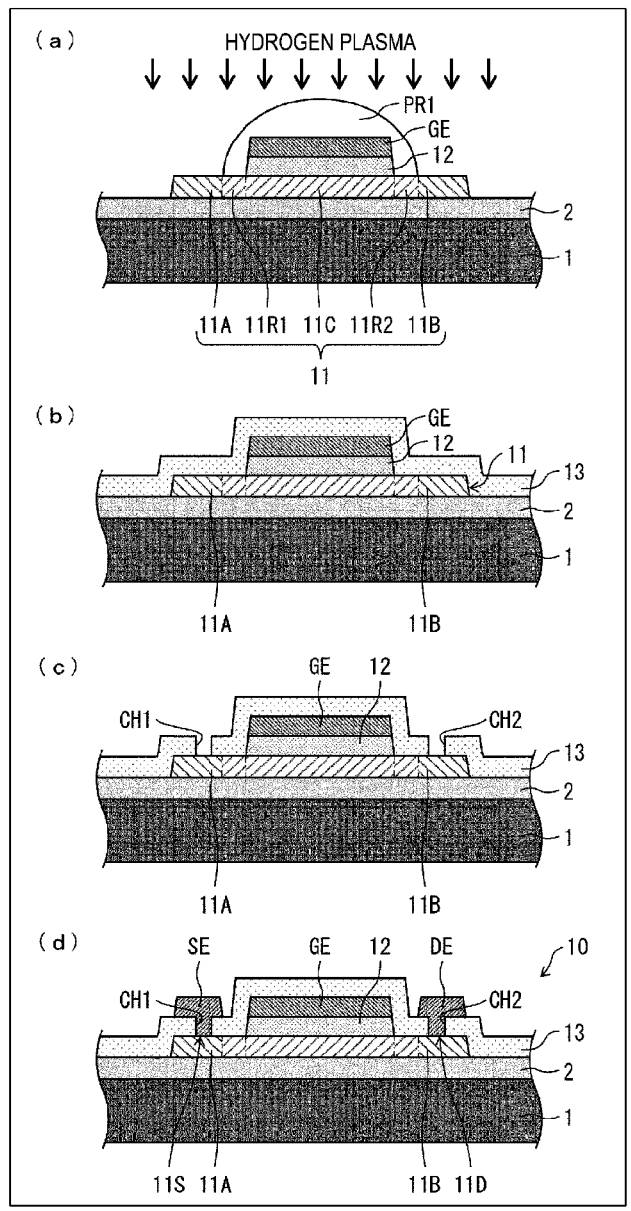
FIGS. 4(a) to 4(d) are cross-sectional views illustrating a sequence of processes for manufacturing the TFT according to the first embodiment of the disclosure, performed after the processes illustrated in (a) to (e) of FIG. 3.

(a) to (e) of FIG. 3 are cross-sectional views illustrating a sequence of processes for manufacturing the TFT 10 according to the present embodiment. (a) to (e) of FIG. 4 are cross-sectional views illustrating a sequence of processes for manufacturing the TFT 10 according to the present embodiment, performed after the processes illustrated in (a) to (e) of FIG. 3.

As illustrated in (a) of FIG. 3, first, the oxide semiconductor layer 11 is film-formed in a solid-like form on the inorganic insulating film 2 (BC layer) film-formed on the support body 1 such that the oxide semiconductor layer 11 covers the entire upper face of the inorganic insulating film 2. The oxide semiconductor layer 11 can be film-formed by, for example, a sputtering method using an In—Ga—Zn—O based oxide target. Further, for example, a CVD method such as a plasma CVD method can be used as a method for film-forming the inorganic insulating film 2 on the support body 1.

Next, as illustrated in (b) of FIG. 3, the oxide semiconductor layer 11 is patterned in an island shape by, for example, wet etching using a mask formed of a photoresist (not illustrated), and then the mask described above is removed. In this way, the oxide semiconductor layer 11 in the island shape is formed on the inorganic insulating film 2.

Next, as illustrated in (c) of FIG. 3, the inorganic insulating film 12 serving as a gate insulating film is film-formed in a solid-like form on the inorganic insulating film 2 so as to cover the oxide semiconductor layer 11 described above such that the inorganic insulating film 12 entirely covers the top of the inorganic insulating film 2. Subsequently, a metal film GEF used for the gate electrode GE is similarly film-formed in a solid-like form on the inorganic insulating film 12. For example, a CVD method such as a plasma CND method is used for the film formation of the inorganic insulating film 12. For example, a sputtering method is used for the film formation of the metal film GEF.

Subsequently, as illustrated in (d) of FIG. 3, the inorganic insulating film 12 and the metal film GEF are patterned in an island shape by performing, for example, dry etching by using a mask formed of a photoresist (not illustrated), and then the mask described above is removed. In this way, the inorganic insulating film 12 (gate insulating film) in the island shape is formed on the oxide semiconductor layer 11 in the island shape, and the gate electrode GE in the island shape formed of the metal film GEF is also formed on the inorganic insulating film 12 in the island shape.

Note that the inorganic insulating film 12 and the gate electrode GE may be collectively etched by using the same mask formed of a photoresist, and after the gate electrode GE is patterned, the inorganic insulating film 12 may be etched with the gate electrode GE as a mask. In this way, the inorganic insulating film 12 and the gate electrode GE having the same shape in the plan view can be formed in alignment with each other in the portion overlapping the oxide semiconductor layer 11. Note that, of course, the inorganic insulating film 12 may be formed in a solid-like form after the gate electrode GE is patterned, and the inorganic insulating film 12 may be subsequently etched.

However, by collectively etching the inorganic insulating film 12 and the gate electrode GE, the dry etching process can be reduced by one step. In addition, since a deviation between the inorganic insulating film 12 and the gate electrode GE does not need to be taken into account, space saving of the TFT 10 can be achieved.

Next, as illustrated in (e) of FIG. 3, a photoresist PR1 that covers the inorganic insulating film 12 and the gate electrode GE is formed as a hydrogen blocking layer on the oxide semiconductor layer 11 described above. At this time, the photoresist PR1 is formed on a part of the oxide semiconductor layer 11 so as to cover a portion of the oxide semiconductor layer 11 that becomes the channel region 11C and the resistive regions 11R1 and 11R2 illustrated in FIG. 1 and, on the other hand, expose a portion that becomes the conductive regions 11A and 11B.

Next, as illustrated in (a) of FIG. 4, the oxide semiconductor layer 11 is irradiated with hydrogen plasma from above the photoresist PR1 with the photoresist PR1 as a mask. In this way, an exposed portion of the oxide semiconductor layer 11 being exposed from the photoresist PR1 is exposed to hydrogen radicals in the hydrogen plasma. As a result, the above-described exposed portion is reduced, oxygen of the exposed portion is extracted, and oxygen deficiency is caused to make the exposed portion conductive (low-resistive). The conductive exposed portion becomes the conductive regions 11A and 11B used in the source region 11S and the drain region 11D. On the other hand, the region on the oxide semiconductor layer 11 covered with the photoresist PR1 is blocked from entry of hydrogen, and is not thus conductive, and is maintained in a state of high resistance as an oxide semiconductor region. A region of the oxide semiconductor region in the oxide semiconductor layer 11 that overlaps the gate electrode GE functions as the channel region 11C. Thus, the resistive region 11R1 that does not function as the channel region 11C and has a higher resistivity than that of the conductive regions 11A and 11B is formed between the channel region 11C and the conductive region 11A in the oxide semiconductor layer 11. Similarly, the resistive region 11R2 that does not function as the channel region 11C and has a higher resistivity than that of the conductive regions 11A and 11B is formed between the channel region 11C and the conductive region 11B in the oxide semiconductor layer 11.

Subsequently, as illustrated in (b) of FIG. 4, the photoresist PR1 is removed, and the inorganic insulating film 13 formed of a silicon oxide film such as $SiO_2$ is formed (film-formed) in a solid-like form on the inorganic insulating film 2 so as to cover the oxide semiconductor layer 11, the inorganic insulating film 12, and the gate electrode GE. For example, a CVD method such as a plasma CVD method can be used for the formation of the inorganic insulating film 13.

Next, as illustrated in (c) of FIG. 4, the contact hole CH1 that extends through the inorganic insulating film 13 and reaches the conductive region 11A, and the contact hole CH2 that extends through the inorganic insulating film 13 and reaches the conductive region 11B are each formed in the inorganic insulating film 13 with the gate electrode GE2 interposed therebetween. The contact holes CH1 and CH2 can be formed by, for example, dry etching using a mask formed of a photoresist (not illustrated).

Subsequently, a metal film (not illustrated) is film-formed on the inorganic insulating film 13 by using a sputtering method or the like, and the metal film is patterned, thereby forming, as illustrated in (d) of FIG. 4, the source electrode SE electrically connected to a part of the conductive region 11A (source region 11S) via the contact hole CH1, and the drain electrode DE electrically connected to a part of the conductive region 11B (drain region 11D) via the contact hole CH2. Note that, for example, dry etching or wet etching using a mask formed of a photoresist (not illustrated) is used for the patterning of the source electrode SE and the drain electrode DE.

In the processes described above, the TFT 10 according to the present embodiment is formed. Further, a flattening film (not illustrated) is formed on the inorganic insulating film 13 so as to cover the TFT 10 described above, thereby forming a TFT substrate including the TFT 10. The inorganic insulating film 13 is used as an interlayer insulating film. A light-emitting element such as an organic EL element is formed on the TFT substrate described above. In this way, the TFT 10 formed on the support body 1 via the inorganic insulating film 2 is then incorporated into the display device through a manufacturing process such as a flattening film forming process for forming a flattening film covering the TFT 10 and a light-emitting element forming process for forming a tight-emitting element such as an organic EL element. The display device is formed by connecting the source electrode SE or the drain electrode DE that is an output terminal of the TFT 10 described above to an electrode of the light-emitting element.

Advantageous Effects

Here, the advantageous effects of the TFT 10 according to the present embodiment will be described below with reference to FIG. 5 to (a) and (b) of FIG. 7.

Figure 5:
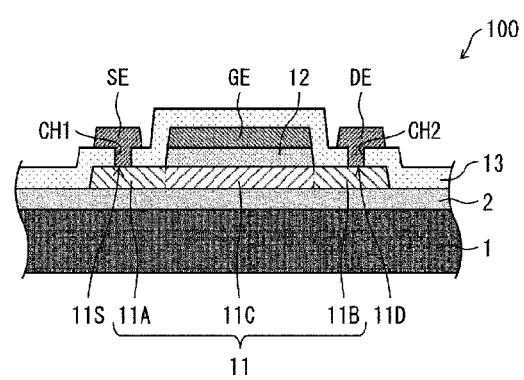
FIG. 5 is a cross-sectional view illustrating a schematic configuration of a TFT for comparison.
Figure 6:
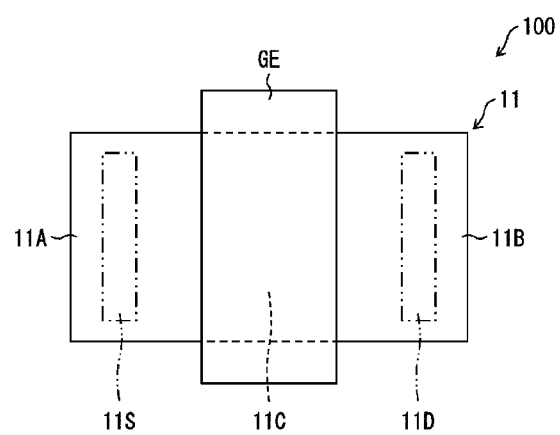
FIG. 6 is a plan view illustrating a schematic configuration of main portions of the TFT for comparison.

FIG. 5 is a cross-sectional view illustrating a schematic configuration of a TFT 100 for comparison. FIG. 6 is a plan view illustrating a schematic configuration of main portions of the TFT 100 for comparison. (a) of FIG. 7 is a graph showing a current-voltage characteristic of the TFT 10 according to the present embodiment. (b) of FIG. 7 is a graph showing a current-voltage characteristic of the TFT 100 for comparison illustrated in FIGS. 5 and 6. Note that (a) and (b) of FIG. 7 are semilogarithmic graphs in which the vertical axis is a drain current Id (logarithmic scale), and the horizontal axis is a gate voltage Vg. Further, FIG. 6 illustrates only an oxide semiconductor layer 11 and a gate electrode GE in the TFT 100 described above. In the YET 100 illustrated in FIGS. 5 and 6, members having the same functions as those of the TFT 10 illustrated in FIG. 1 are denoted by the same reference numerals, and descriptions thereof will be omitted.

In the TFT 100 illustrated in FIGS. 5 and 6, an inorganic insulating film 13 is formed of a silicon nitride film such as $SiN_x$, and resistive regions 11R1 and 11R2 are not provided in the oxide semiconductor layer 11. The TFT 100 described above has the same configuration as that of the TFT 10 according to the present embodiment except that the inorganic insulating film 13 is formed of the silicon nitride film, and conductive regions 11A and 11B are each provided adjacent to a channel region 11C with the channel region 11C interposed therebetween.

Figure 7:
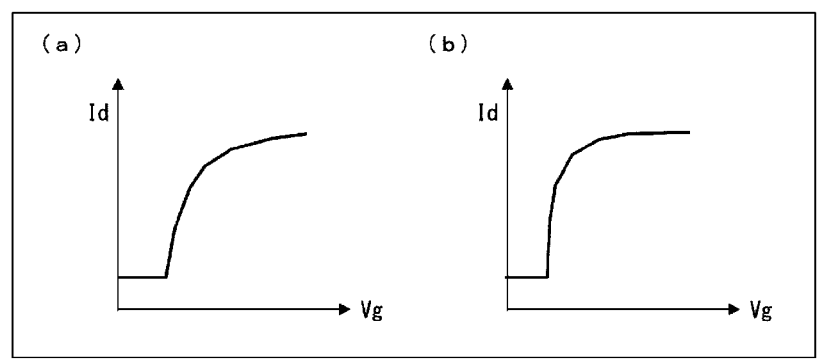
FIG. 7(a) is a graph showing a current-voltage characteristic of the TFT according to the first embodiment of the disclosure.
FIG. 7(b) is a graph showing a current-voltage characteristic of the TFT for comparison illustrated in FIGS. 5 and 6.

As illustrated in (b) of FIG. 7, such a TFT 100 has a steep rise (subthreshold slope) of a drive voltage in the current-voltage characteristic (Id-Vg curve). Thus, such a TFT 100 has a great amount of change in current when a voltage is changed, and is unsuitable for a display device that performs current driving such as an organic EL display device.

In contrast, according to the present embodiment, by providing the resistive regions 11R1 and 11R2 between the channel region 11C and the conductive regions 11A and 11B, the drain current Id is less likely to flow, and, when the gate voltage Vg is changed, the drain current Id stepwisely gradually increases. In other words, as compared to the TFT 100 illustrated in FIGS. 5 and 6, the TFT 10 according to the present embodiment can reduce the amount of change in the drain current Id when the gate voltage Vg is changed. Thus, as illustrated in (a) of FIG. 7, the TFT 10 according to the present embodiment has a gentle rise (subthreshold slope) of a drive voltage in the current-voltage characteristic (Id-Vg curve), and has a high S value (subthreshold coefficient), as compared to (b) of FIG. 7. Thus, the TFT 10 according to the present embodiment can be suitably used for a current driving type display device such as an organic EL display device, for example. Note that the TFT 10 may be a drive transistor or a switching transistor.

In addition, according to the present embodiment, since hydrogen is injected in the conductive regions 11A and 11B by irradiating the oxide semiconductor layer 11 with hydrogen plasma by using the photoresist PR1, the conductive regions 11A and 11B can be freely set. Thus, according to the present embodiment, the formation of the resistive regions 11R1 and 11R2 can be finely controlled.

Display Device

An example of a display device using the TFT 10 according to the present embodiment will be described below with reference to FIG. 8.

Figure 8:
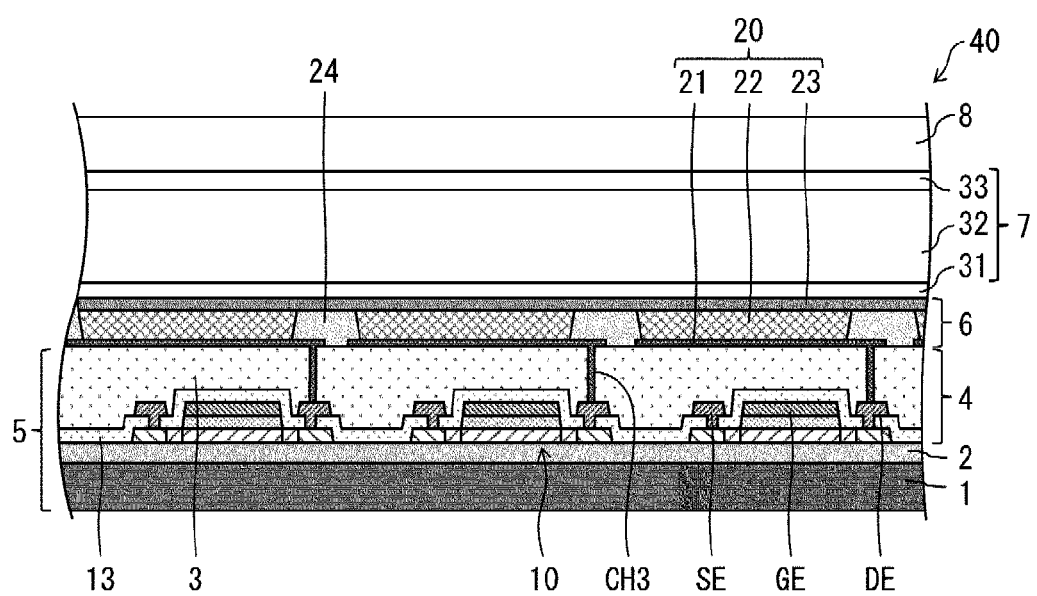
FIG. 8 is a cross-sectional view illustrating an example of a schematic configuration of main portions of a display device according to the first embodiment of the disclosure.

FIG. 8 is a cross-sectional view illustrating an example of a schematic configuration of main portions of a display device 40 according to the present embodiment.

As illustrated in FIG. 8, in such a display device 40, the TFT 10 described above is formed on the support body 1 via the inorganic insulating film 2 (BC layer), and a light-emitting element layer 6 is provided on the TFT 10 via a flattening film 3 formed of an inorganic insulating film. Note that the display device 40 may be a bendable flexible display device that has flexibility, or may be a non-bendable display device that has rigidity.

As described above, a TFT substrate 5 including the TFT 10 is formed by forming the flattening film 3 on the inorganic insulating film 13 (interlayer insulating film) so as to cover the TFT 10. The light-emitting element layer 6 including a light-emitting element 20 such as an organic EL element is formed on the TFT substrate 5. The TFT substrate 5 has a configuration in which a TFT layer 4 including the TFT 10 is provided on the support body 1 via the inorganic insulating film 2.

The TFT layer 4 includes the TFT 10 and wiring (not illustrated) provided on the inorganic insulating film 2, and the flattening film 3 covering the TFT 10 and the wiring. The wiring described above includes a gate wiring line (not illustrated) electrically connected to the gate electrode GE, a source wiring line (not illustrated) electrically connected to the source electrode SE, a capacitance wiring line (not illustrated), and the like. The source wiring line and the gate wiring line are provided orthogonal to each other, and the TFT 10 is provided for each intersecting portion of the gate wiring line and the source wiring line. A terminal portion (not illustrated) is provided on an end portion (a non-active area that does not overlap the light-emitting element layer 6) of the TFT layer 4.

The light-emitting element layer 6 includes the plurality of light-emitting elements 20 provided for each pixel and an edge cover 24. One picture element that is the smallest unit of the display is formed of, for example, R (red), G (green), and B (blue) pixels. The light-emitting element 20 includes a first electrode 21 that is an upper layer overlying the flattening film 3, a function layer 22 that is an upper layer overlying the first electrode 21, and a second electrode 23 that is an upper layer overlying the function layer 22.

The first electrode 21 is electrically connected to the drain electrode DE via a contact hole CH3 provided in the flattening film 3, After the formation of the flattening film 3, the first electrode 21 can be formed by forming, for example, the contact hole CH3 that reaches the drain electrode DE in the flattening film 3, forming a metal film (not illustrated) on the flattening film 3 by using a sputtering method or the like, and performing patterning.

The first electrode 21 is an anode electrode (pattern anode electrode) formed in an island shape for each pixel, and the second electrode 23 is a cathode electrode (common cathode electrode) formed in a solid-like form common to all of the pixels. However, the first electrode 21 may be a cathode electrode and the second electrode 23 may be an anode electrode.

The edge cover 24 covers an edge of the first electrode 21. The edge cover 24 is formed of a photosensitive organic material, and also functions as a pixel separation layer that prevents a short circuit between the first electrode 21 and the second electrode 23 at a pattern edge of the first electrode 21 and also separates each pixel.

When the display device 40 is an organic EL display device, the function layer 22 between the first electrode 21 and the second electrode 23 is, for example, an organic layer referred to as an organic EL layer. The function layer 22 may include at least a light-emitting layer.

A sealing layer 7 that prevents foreign matters (for example, water, oxygen, and the like) from penetrating into an interior of the light-emitting element layer 6 is provided on the light-emitting element layer 6. The sealing layer 7 includes, for example, an inorganic sealing film 31 that is an upper layer overlying the second electrode 23, an organic sealing film 32 that is an upper layer overlying the inorganic sealing film 31, and an inorganic sealing film 33 that is an upper layer overlying the organic sealing film 32.

A cover body 8 is provided on the sealing layer 7. The cover body 8 has a predetermined function (for example, an optical compensation function, a touch sensor function, a protection function, or the like).

According to the present embodiment, a current flows from the source electrode SE to the drain electrode DE via the channel region 11C and the resistive regions 11R1 and 11R2, and thus the amount of change in the current injected into the light-emitting layer in the light-emitting element such as the organic EL element is suppressed by application of a voltage to the gate electrode GE.

Modified Example

In the present embodiment, as described above, the case in which the gate electrode GE and the inorganic insulating film 12 are formed in alignment with each other by, for example, collectively patterning the inorganic insulating film 12 and the gate electrode GE by using the same mask is described as an example. However, according to the present embodiment, as illustrated in FIG. 4(*a*), even when the gate electrode GE and the inorganic insulating film 12 are not aligned with each other (for example, a portion of the inorganic insulating film 12 overlapping the gate electrode GE does not have the same size as that of the gate electrode GE in the plan view), the resistive regions 11R1 and 11R2 can be formed so as to be adjacent to the channel region 11C by irradiating the oxide semiconductor layer 11 with hydrogen plasma from above the photoresist PR1. Thus, the inorganic insulating film 12 may be formed in alignment with the gate electrode GE, and may be formed larger than the gate electrode GE in the portion overlapping the gate electrode GE. For example, the gate electrode GE may be formed in the size so as to overlap the channel region 11C and the resistive regions 11R1 and 11R2 in the plan view.

Second Embodiment

A description will be given of another embodiment of the disclosure with reference to FIG. 9 to (a) to (d) of FIG. 11. Note that the present embodiment will be described in terms of the differences between the present embodiment and the first embodiment, and components having the same function as the components described in the first embodiment are assigned the same reference signs, and a description thereof is omitted.

Schematic Configuration of TFT 10

Figure 9:
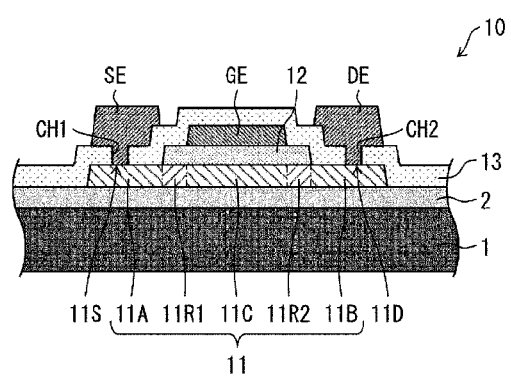
FIG. 9 is a cross-sectional view illustrating a schematic configuration of a TFT according to a second embodiment of the disclosure.

FIG. 9 is a cross-sectional view illustrating a schematic configuration of a TFT 10 according to the present embodiment. Note that a plan view illustrating a schematic configuration of main portions of the TFT 10 according to the present embodiment is the same as FIG. 2.

The TFT 10 and a display device 40 including the TFT 10 according to the present embodiment are the same as the TFT 10 and the display device 40 according to the first embodiment except for the following points. In the present embodiment, as illustrated in FIG. 9, in the TFT 10, an inorganic insulating film 12 (gate insulating film) in a portion overlapping an oxide semiconductor layer 11 formed in an island shape is formed in an island shape smaller than the oxide semiconductor layer 11 and larger than a gate electrode GE formed in an island shape, and covers the oxide semiconductor layer 11 except for conductive regions 11A and 11B. In other words, in the present embodiment, the inorganic insulating film 12 is formed on a channel region 11C and on resistive regions 11R1 and 11R2 in the oxide semiconductor layer 11, and the resistive regions 11R1 and 11R2 do not contact an inorganic insulating film 13. On the other hand, the inorganic insulating film 13 is formed on the conductive regions 11A and 11B. The inorganic insulating film 13 is formed of a silicon nitride film such as $SiN_x$ and SiNO.

Manufacturing Method of TFT 10

Figure 10:
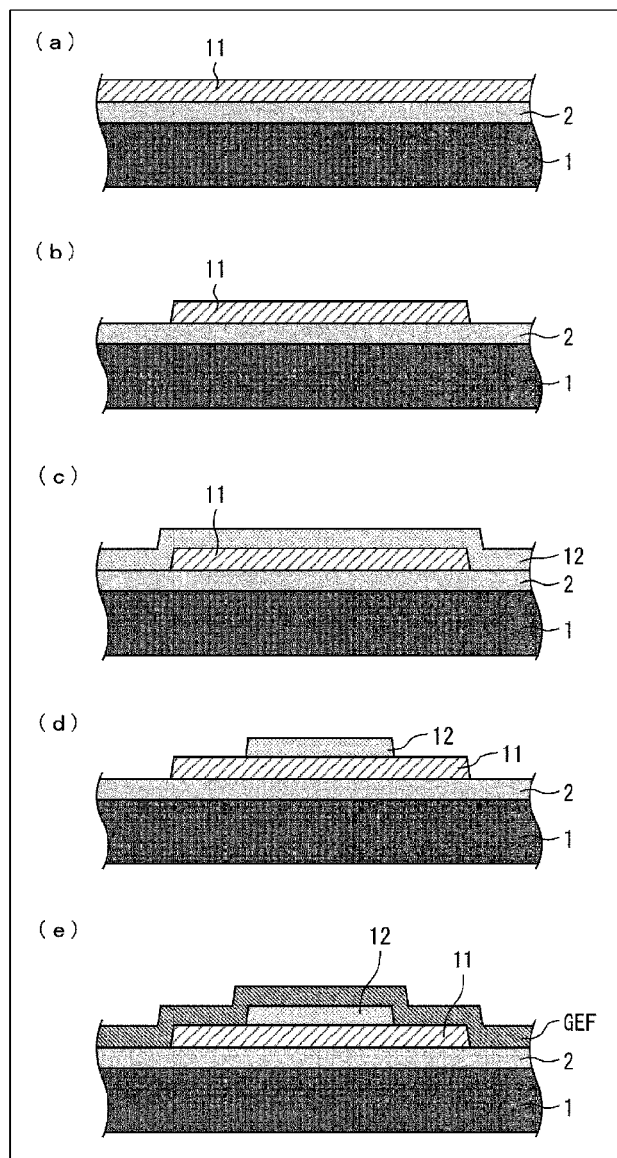
FIGS. 10(a) to 10(e) are cross-sectional views illustrating a sequence of processes for manufacturing the TFT according to the second embodiment of the disclosure.

(a) to (e) of FIG. 10 are cross-sectional views illustrating a sequence of processes for manufacturing the TFT 10 according to the present embodiment. (a) to (d) of FIG. 11 are cross-sectional views illustrating a sequence of processes for manufacturing the TFT 10 according to the present embodiment, performed after the processes illustrated in (a) to (e) of FIG. 10. Note that, in the following description, a material and a film formation method for each layer are the same as the material and the film formation method described in the first embodiment unless stated otherwise.

The processes illustrated in (a) and (b) of FIG. 10 are the same as the processes illustrated in (a) and (b) of FIG. 3. In the present embodiment, after the process illustrated in (b) of FIG. 10, as illustrated in (c) of FIG. 10, the inorganic insulating film 12 is film-formed in a solid-like form on an inorganic insulating film 2 so as to cover the oxide semiconductor layer 11.

Next, as illustrated in (d) of FIG. 10, the inorganic insulating film 12 is patterned such that a portion of the inorganic insulating film 12 overlapping the oxide semiconductor layer 11 has an island shape smaller than the oxide semiconductor layer 11 and larger than the gate electrode GE by performing, for example, dry etching on the inorganic insulating film 12 by using a mask formed of photoresist (not illustrated), and then the mask described above is removed.

Next, as illustrated in (e) of FIG. 10, a metal film GEE used for the gate electrode GE is film-formed in a solid-like form on the inorganic insulating film 2 so as to cover the above-described inorganic insulating film 12 (gate insulating film) in the island shape described above.

Subsequently, as illustrated in (a) of FIG. 11, the metal film GEF is patterned such that a portion of the metal film GEF overlapping the oxide semiconductor layer 11 has an island shape smaller than the inorganic insulating film 12 in the island shape by performing, for example, dry etching on the metal film GEE by using a mask formed of a photoresist (not illustrated), and then the mask described above is removed. In this way, the gate electrode GE that is formed of the metal film GEF described above and has an island shape smaller than the above-described inorganic insulating film 12 in the island shape is formed on the inorganic insulating film 12 in the island shape formed on the oxide semiconductor layer 11.

Figure 11:
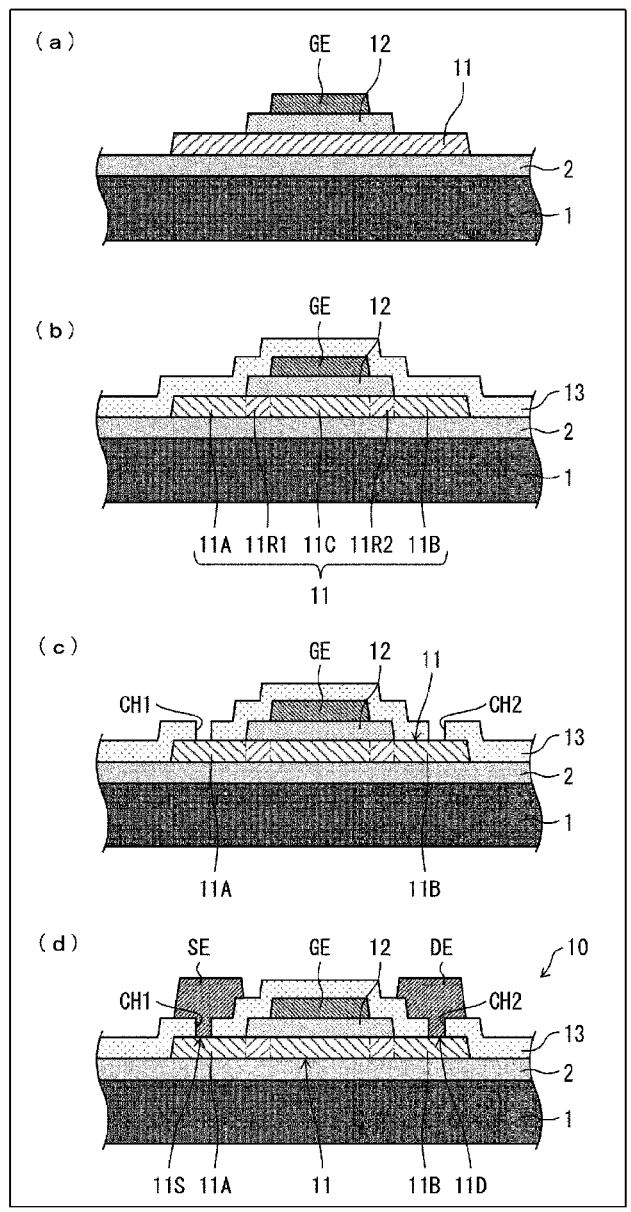
FIGS. 11(a) to 11(d) are cross-sectional views illustrating a sequence of processes for manufacturing the TFT according to the second embodiment of the disclosure, performed after the processes illustrated in (a) to (e) of FIG. 10.

Next, as illustrated in (b) of FIG. 11, the inorganic insulating film 13 formed of a silicon nitride film is formed (film-formed) in a solid-like form on the inorganic insulating film 2 so as to cover the oxide semiconductor layer 11 described above, the inorganic insulating film 12, and the gate electrode GE by a plasma CVD method in which a gas containing hydrogen is introduced.

In this way, an exposed portion of the oxide semiconductor layer 11 exposed from the inorganic insulating film 12 is reduced, and oxygen extracted from the exposed portion is taken into the inorganic insulating film 13. As a result, oxygen deficiency is caused and the exposed portion is made low-resistive to make the exposed portion conductive (low-resistive). The conductive exposed portion becomes the conductive regions 11A and 11B used in a source region 11S and a drain region 11D. On the other hand, the region of the oxide semiconductor layer 11 covered with the inorganic insulating film 12 is blocked from entry of hydrogen, and is not thus conductive, and maintained in a state of high resistance.

Therefore, in the present embodiment, the region of the oxide semiconductor layer 11 that is covered with the inorganic insulating film 12 and does not contact the inorganic insulating film 13 becomes a relatively high-resistance oxide semiconductor region, whereas the region of the oxide semiconductor layer 11 that contacts the inorganic insulating film 13 becomes relatively low-resistance conductive regions 11A and 11B. Then, also in the present embodiment, as described above, the region of the oxide semiconductor region covered with the inorganic insulating film 12 that overlaps the gate electrode GE functions as the channel region 11C. Thus, also in the present embodiment, similarly to the first embodiment, the resistive region 11R1 is formed between the channel region 11C and the conductive region 11A in the oxide semiconductor layer 11, and the resistive region 11R2 is formed between the channel region 11C and the conductive region 11B.

Next, similarly to the process illustrated in (c) of FIG. 4, as illustrated in (c) of FIG. 11, a contact hole CH1 that extends through the inorganic insulating film 13 and reaches the conductive region 11A and a contact hole CH2 that extends through the inorganic insulating film 13 and reaches the conductive region 11B are each formed in the inorganic insulating film 13. Subsequently, similarly to the process illustrated in (d) of FIG. 4, as illustrated in (d) of FIG. 11, a source electrode SE electrically connected to a part of the conductive region 11A (source region 11S) via the contact hole CH1, and a drain electrode DE electrically connected to a part of the conductive region 11B (drain region 11D) via the contact hole CH2 are formed.

In the processes described above, the TFT 10 according to the present embodiment is formed. In the present embodiment, in the processes described above, the region that contacts the inorganic insulating film 13 and the region overlapping the source electrode SE and the drain electrode DE in the oxide semiconductor layer 11 are the conductive regions 11A and 11B. In addition, the region of the oxide semiconductor layer 11 that does not overlap the gate electrode GE in the region that contacts the inorganic insulating film 12 is the resistive regions 11R1 and 11R2. In addition, although not illustrated in the drawings, a TFT substrate 5 including the TFT 10 described above is formed by forming a flattening film 3 on the inorganic insulating film 13 so as to cover the TFT 10 described above.

Advantageous Effects

As described above, according to the present embodiment, similarly to the first embodiment, by providing the resistive regions 11R1 and 11R2 between the channel region 11C and the conductive regions 11A and 11B in the oxide semiconductor layer 11, it is possible to provide the TFT 10 that has a gentle rise of a drive voltage in the current-voltage characteristic, has a high S value (subthreshold coefficient), and is suitable for a current driving type display device, and a manufacturing method of the TFT 10. Further, by incorporating the TFT 10 described above into a display device (for example, the display device 40), it is possible to provide the display device having a gentle rise of a drive voltage in the current-voltage characteristic.

Further, according to the present embodiment, since the resistive regions 11R1 and 11R2 can be formed without providing the photoresist PR1, the manufacturing process can be simplified as compared to the first embodiment.

Third Embodiment

A description will be given of yet another embodiment of the disclosure with reference to FIG. 12 to (a) to (d) of FIG. 14. Note that the present embodiment will be described in terms of the differences between the present embodiment and the first and second embodiments, and components having the same function as the components described in the first and second embodiments are assigned the same reference signs, and a description thereof is omitted.

Schematic Configuration of TFT Substrate 5

Figure 12:
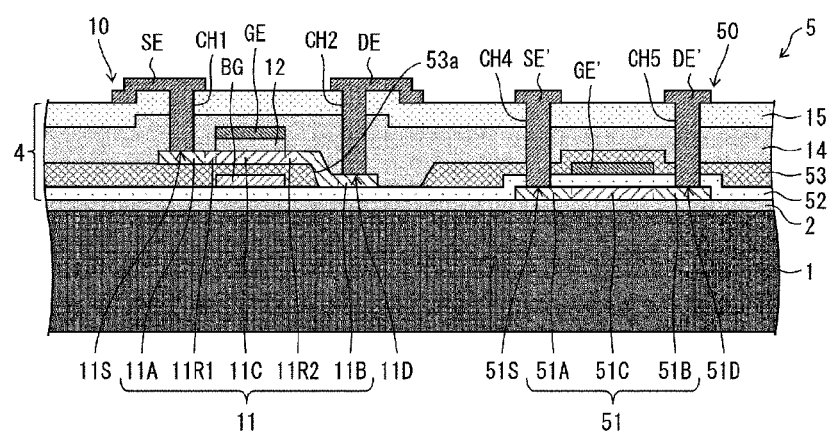
FIG. 12 is a cross-sectional view illustrating a schematic configuration of main portions of a TFT substrate according to a third embodiment of the disclosure.
Figure 13:
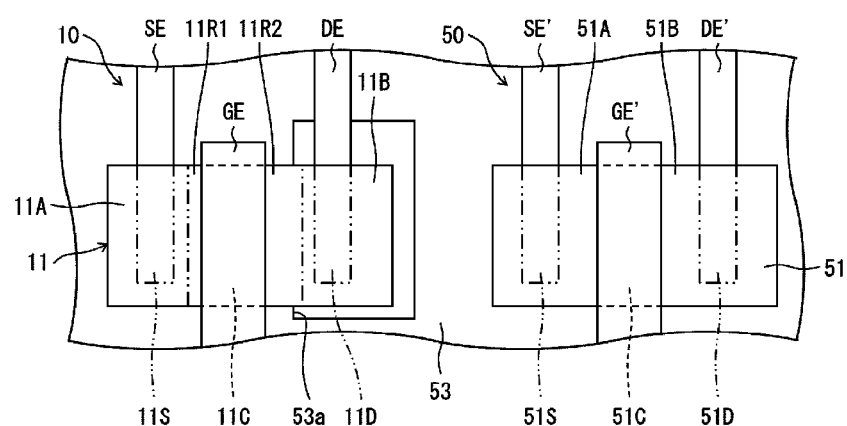
FIG. 13 is a plan view illustrating the schematic configuration of the main portions of the TFT substrate according to the third embodiment of the disclosure.

FIG. 12 is a cross-sectional view illustrating a schematic configuration of main portions of a TFT substrate 5 according to the present embodiment. FIG. 13 is a plan view illustrating the schematic configuration of the main portions of the TFT substrate 5 according to the present embodiment. Note that FIG. 13 illustrates only an oxide semiconductor layer 11, a gate electrode GE, a source electrode SE, and a drain electrode DE in a TFT 10, and a semiconductor layer 51, a gate electrode GE', a source electrode SE', and a drain electrode DE' in a TFT 50, and an inorganic insulating film 53 in the TFTs 10 and 50. Further, a flattening film 3 is not illustrated in FIG. 12.

As illustrated in FIGS. 12 and 13, the TFT substrate 5 according to the present embodiment includes, on a support body 1, a plurality of TFTs including the TFT 10 including the oxide semiconductor layer 11 and the TFT 50 including the semiconductor layer 51 made of low-temperature polysilicon (LTPS). The TFTs 10 and 50 are provided in, for example, the same pixel of the TFT substrate 5 in a display device 40.

The TFT substrate 5 according to the present embodiment has a configuration in which an inorganic insulating film 2, the semiconductor layer 51 made of low-temperature polysilicon (LTPS), an inorganic insulating film 52, the gate electrode GE' and a back gate electrode BG, the inorganic insulating film 53, the oxide semiconductor layer 11, an inorganic insulating film 12, the gate electrode GE, an inorganic insulating film 14, an inorganic insulating film 15, the source electrodes SE and SE', and the drain electrodes DE and DE' are layered in this order on the support body 1. The TFT 10 and the TFT 50 are connected by a wiring line provided in the same layer as the source electrodes SE and SE' and the drain electrodes DE and DE'.

In the present embodiment, instead of an inorganic insulating film 13, the inorganic insulating films 14 and 15 are provided as an interlayer insulating film. The inorganic insulating film 14 is formed of a silicon oxide film such as $SiO_2$. The inorganic insulating film 15 is formed of a silicon nitride film such as $SiN_x$ and SiNO.

The TFT 10 according to the present embodiment includes the back gate electrode BG, the inorganic insulating film 53 that is an upper layer overlying the back gate electrode BG, the oxide semiconductor layer 11 that is an upper layer overlying the inorganic insulating film 53, the inorganic insulating film 12 that is an upper layer overlying the oxide semiconductor layer 11, the gate electrode GE (top gate electrode) that is an upper layer overlying the inorganic insulating film 12, the inorganic insulating film 14 that is an upper layer overlying the gate electrode GE, the inorganic insulating film 15 that is an upper layer overlying the inorganic insulating film 14, and the source electrode SE and the drain electrode DE that are an upper layer overlying the inorganic insulating film 15.

The TFT 50 is a top gate type transistor, and includes the semiconductor layer 51 made of low-temperature polysilicon (LTPS), the inorganic insulating film 52 that is an upper layer overlying the semiconductor layer 51, the gate electrode GE' that is an upper layer overlying the inorganic insulating film 52, the inorganic insulating film 53 that is an upper layer overlying the gate electrode GE', the inorganic insulating film 14 that is an upper layer overlying the inorganic insulating film 53, the inorganic insulating film 15 that is an upper layer overlying the inorganic insulating film 14, and the source electrode SE' and the drain electrode DE' that are an upper layer overlying the inorganic insulating film 15.

The inorganic insulating film 52 functions as a gate insulating film in the TFT 50. The inorganic insulating film 53 functions as a gate insulating film for the back gate electrode BG in the TFT 10, and also functions as an underlayer for forming the oxide semiconductor layer 11 in the TFT 10. The inorganic insulating film 12 functions as a gate insulating film for the gate electrode GE in the TFT 10. The inorganic insulating films 14 and 15 are used as an interlayer insulating film of the TFT 10, and the inorganic insulating films 53, 14, and 15 are used as an interlayer insulating film of the TFT 50.

Also, in the present embodiment, the oxide semiconductor layer 11 includes a channel region 11C, resistive regions 11R1 and 11R2, and conductive regions 11A and 11B. The gate electrode GE and the back gate electrode BG are disposed and face each other with the oxide semiconductor layer 11 and the inorganic insulating films 12 and 53 interposed therebetween so as to overlap the channel region 11C in the oxide semiconductor layer 11.

The semiconductor layer 51 includes a channel region 51C and high-concentration impurity injection regions 51A and 51B (low-resistive regions) each provided adjacent to the channel region 51C with the channel region 51C interposed therebetween. The high-concentration impurity injection regions 51A and 51B are formed by injecting (doping) impurities into the semiconductor layer 51 at a high concentration, and have a resistance lower than a resistance of the channel region 51C. The high-concentration impurity injection region 51A is used for a source region 51S connected to the source electrode SE'. The high-concentration impurity injection region 51B is used for a drain region 51D connected to the drain electrode DE'.

In the present embodiment, as illustrated in FIGS. 12 and 13, the inorganic insulating film 53 formed of a silicon oxide film such as $SiO_2$ is provided as an underlayer in a lower layer of the oxide semiconductor layer 11 in the TFT 10. A slit 53a having a tapered opening end face is provided in the inorganic insulating film 53 so as to surround the conductive region 11B in the plan view. In this way, the inorganic insulating film 53 includes a step portion formed by the slit 53a.

The oxide semiconductor layer 11 is formed in an island shape covering a part of the opening end face of the slit 53a. A part of the oxide semiconductor layer 11 is formed in a step shape from the top of the inorganic insulating film 53 into the slit 53a of the inorganic insulating film 53. Thus, the oxide semiconductor layer 11 includes a step portion along one step portion of the inorganic insulating film 53 by the slit 53a. In the present embodiment, the resistive region 11R2 is provided in the step portion of the oxide semiconductor layer 11 (in other words, a portion of the oxide semiconductor layer 11 that covers the opening end face of the slit 53a), and the conductive region 11B is provided in a part in the slit 53a.

Manufacturing Method of TFT Substrate 5

Next, a manufacturing method of the TFT 10 according to the present embodiment will be described together with a manufacturing method of the TFT 50 with reference to (a) to (d) of FIG. 14.

Figure 14:
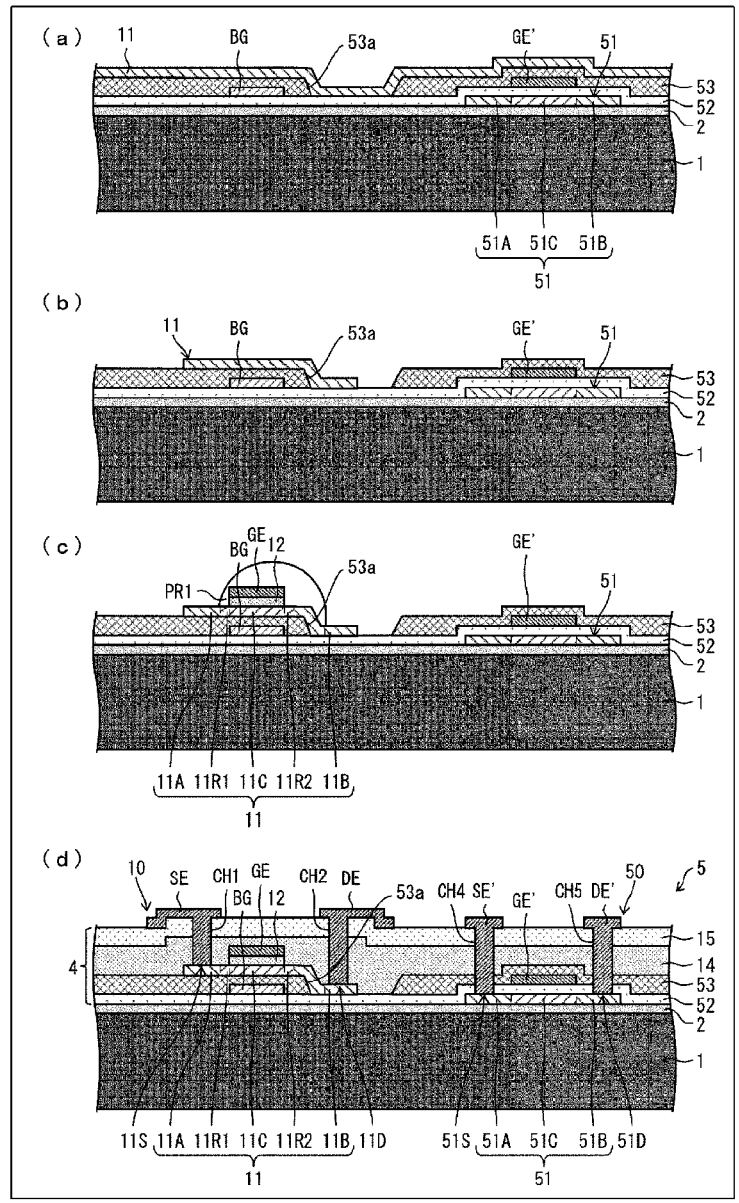
FIGS. 14(a) to 14(d) are cross-sectional views illustrating a sequence of processes for manufacturing the TFT substrate according to the third embodiment of the disclosure.

(a) to (d) of FIG. 14 are cross-sectional views illustrating a sequence of processes for manufacturing the TFT substrate 5 according to the present embodiment. Note that, in the following description, a material and a film formation method for each layer are the same as the material and the film formation method described in the first or second embodiment unless stated otherwise.

In the present embodiment, as illustrated in (a) of FIG. 14, first, the inorganic insulating film 2 is film-formed in a solid-like form on the support body 1. Next, for example, an amorphous silicon film is film-formed in a solid-like form on the inorganic insulating film 2 and made polycrystalline by irradiation with excimer laser light, thereby forming a polysilicon film. Next, the polysilicon film is patterned into an island shape by using a mask formed of a photoresist (not illustrated), thereby forming the semiconductor layer 51 in an island shape formed of the polysilicon film.

Subsequently, the inorganic insulating film 52 is film-formed in a solid-like form on the inorganic insulating film 2 so as to cover the semiconductor layer 51 described above. Next, a metal film as a gate metal film is film-formed in a solid-like form on the inorganic insulating film 52, and the metal film is dry etched by using a mask formed of a photoresist (not illustrated), thereby forming the gate electrode GE' that intersects the semiconductor layer 51, and the back gate electrode BG. Subsequently, impurities such as phosphorus and boron are injected at a high concentration into the semiconductor layer 51 in a self-aligned manner with respect to the gate electrode GE' with the gate electrode GE' as a mask. In this way, the channel region 51C that overlaps the gate electrode GE' and the high-concentration impurity injection regions 51A and 51B adjacent to the channel region 51C are formed in the semiconductor layer 51.

Subsequently, the mask formed of the photoresist described above is removed, and the inorganic insulating film 53 formed of a silicon oxide film such as $SiO_2$ is film-formed in a solid-like form on the inorganic insulating film 52 so as to cover the gate electrode GE' and the back gate electrode BG.

Next, the inorganic insulating film 53 is, for example, dry etched by using a mask (not illustrated), and the mask described above is removed, thereby forming the slit 53a having a tapered opening end face in the inorganic insulating film 53.

Next, the oxide semiconductor layer 11 is film-formed in a solid-like form on the inorganic insulating film 53 and the inorganic insulating film 52 exposed from the slit 53a.

Subsequently, for example, the oxide semiconductor layer 11 is wet etched by using a mask formed of a photoresist (not illustrated) and is patterned, thereby forming the oxide semiconductor layer 11 in an island shape that is provided in a step shape from the top of the inorganic insulating film 53 into the slit 53a of the inorganic insulating film 53, as illustrated in (b) of FIG. 14. A part of the above-described oxide semiconductor layer 11 formed in this manner covers a part of the opening end face of the slit 53a and reaches the inside of the slit 53a. Thus, a step portion along one step portion of the inorganic insulating film 53 by the slit 53a is formed in the oxide semiconductor layer 11.

Next, similarly to (c) and (d) of FIG. 3, as illustrated in (c) of FIG. 14, the inorganic insulating film 12 and the gate electrode GE each in an island shape formed in alignment with each other in a portion overlapping the oxide semiconductor layer 11 are formed on the oxide semiconductor layer 11 in the island shape. Subsequently, similarly to (e) of FIG. 3 and (a) of FIG. 4, the oxide semiconductor layer 11 is irradiated with hydrogen plasma by using a photoresist PR1. However, in the present embodiment, at this time, the photoresist PR1 is formed on the oxide semiconductor layer 11 such that the photoresist PR1 covers the inorganic insulating film 12 and the gate electrode GE and also covers a part of the step portion of the oxide semiconductor layer 11. The photoresist PR1 is formed in a region located above the opening end of the slit 53a of the inorganic insulating film 53 (in other words, a region that becomes the channel region 11C and the resistive regions 11R1 and 11R2 illustrated in FIGS. 12 and 13). In this way, the channel region 11C, the conductive regions 11A and 11B, and the resistive regions 11R1 and 11R2 are formed in the oxide semiconductor layer 11.

After the photoresist PR1 is removed, in the present embodiment, as illustrated in (d) of FIG. 14, the inorganic insulating film 14 formed of a silicon oxide film such as $SiO_2$ is film-formed in a solid-like form so as to cover the oxide semiconductor layer 11, the inorganic insulating film 12, and the gate electrode GE, and then the inorganic insulating film 15 formed of a silicon nitride film such as $SiN_x$ and SiNO is film-formed in a solid-like form on the inorganic insulating film 14.

Next, a contact hole CH1 that extends through the inorganic insulating films 14 and 15 and reaches the conductive region 11A, and a contact hole CH2 that extends through the inorganic insulating films 14 and 15 and reaches the conductive region 11B are each formed in the inorganic insulating films 14 and 15 with the gate electrode GE interposed therebetween, and a contact hole CH4 that extends through the inorganic insulating films 14 and 15 and reaches the high-concentration impurity injection region 51A and a contact hole CH5 that extends through the inorganic insulating films 14 and 15 and reaches the high-concentration impurity injection region 51B are each formed in the inorganic insulating films 14 and 15 with the gate electrode GE' interposed therebetween.

Subsequently, a metal film (not illustrated) is film-formed and patterned on the inorganic insulating film 15, thereby forming the source electrodes SE and SE electrically connected to corresponding source regions 11S and 51S and the drain electrodes DE and DE' electrically connected to corresponding drain regions 11D and 51D. The subsequent process is the same as that in the first and second embodiments.

Advantageous Effects

According to the present embodiment, it is possible to provide the TFT substrate 5 in which the TFT 10 that has a gentle rise of a drive voltage in the current-voltage characteristic, has a high S value, is suitable for a current driving type display device, and uses an oxide semiconductor and the TFT 50 that uses LTPS are mixed.

Further, for example, as illustrated in FIG. 1, in the TFT 10, the resistive region 11R1 and the resistive region 11R2 are provided so as to be left-right symmetrical with the channel region 11C interposed therebetween, and the conductive region 11A and the conductive region 11B are also provided so as to be left-right symmetrical. However, in the present embodiment, since the step portion is provided in the oxide semiconductor layer 11, the resistive region 11R2 can be provided in a height direction by using the step portion of the oxide semiconductor layer 11. In other words, a width of the resistive region 11R2 between the channel region 11C and the conductive region 11B can be increased by the height of the step portion described above. Therefore, in the present embodiment, the resistive region 11R2 of the step portion described above is emphasized and illustrated, but, for example, the width of the resistive region 11R2 in the plan view can be shortened as compared to the first and second embodiments. Thus, according to the present embodiment, space saving of the TFT 10 can be achieved as compared to the first and second embodiments.

Modified Example 1

Note that, in the present embodiment, the case in which the TFT 10 including the oxide semiconductor layer 11 and the TFT 50 including the semiconductor layer 51 made of LTPS are provided on the same TFT substrate 5, particularly, in the same pixel is described as an example. However, the present embodiment is not limited to this, and instead of the TFT 50 including the semiconductor layer 51 made of LTPS, a TFT including the oxide semiconductor layer 11 in which the conductive regions 11A and 11B are provided adjacent to the channel region 11C may be provided. In other words, the TFT 10 including the resistive regions 11R1 and 11R2 in the oxide semiconductor layer 11 and the TFT that does not include the resistive regions 11R1 and 11R2 in the oxide semiconductor layer 11 may be provided on the same TFT substrate 5, particularly in the same pixel.

Modified Example 2

Further, in the present embodiment, the case in which e inorganic insulating film 53 includes the slit 53a, and the oxide semiconductor layer 11 includes the step portion along one step portion of the inorganic insulating film 53 by the slit 53a is described as an example. However, the present embodiment is not limited to this, and the TFT 10 may have a configuration in which the slit 53a is not provided in the inorganic insulating film 53. In other words, the TFT 10 may have a configuration in which the oxide semiconductor layer 11 does not include the step portion, and the oxide semiconductor layer 11 is formed in the island shape on the solid-like inorganic insulating film 53.

Fourth Embodiment

A description will be given of yet another embodiment of the disclosure with reference to FIGS. 15 and 16. Note that the present embodiment will be described in terms of the differences between the present embodiment and the first to third embodiments, and components having the same function as the components described in the first to third embodiments are assigned the same reference signs, and a description thereof is omitted.

Figure 15:
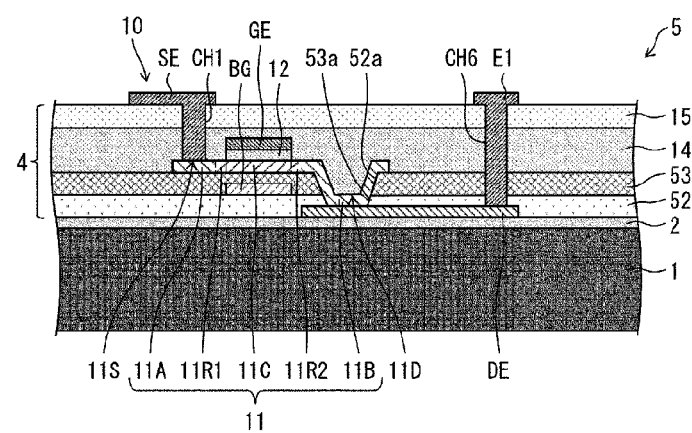
FIG. 15 is a cross-sectional view illustrating a schematic configuration of main portions of a TFT substrate according to a fourth embodiment of the disclosure.

FIG. 15 is a cross-sectional view illustrating a schematic configuration of main portions of a TFT substrate 5 according to the present embodiment. FIG. 16 is a plan view illustrating a schematic configuration of main portions of a TFT 10 according to the present embodiment. Note that FIG. 16 illustrates only an oxide semiconductor layer 11, a gate electrode GE, a source electrode SE, a drain electrode DE, an inorganic insulating film 53, and a wiring line W1, Further, a flattening film 3 is not illustrated in FIG. 15.

The TFT substrate 5 according to the present embodiment has a configuration in which an inorganic insulating film 2, the drain electrode DE made of low-temperature polysilicon (LTPS) in which impurities are injected, an inorganic insulating film 52, a back gate electrode BG, the inorganic insulating film 53, the oxide semiconductor layer 11, an inorganic insulating film 12, the gate electrode GE, an inorganic insulating film 14, an inorganic insulating film 15, the source electrode SE, and an electrode E1 electrically connected to the drain electrode DE are layered in this order on a support body 1.

The TFT 10 according to the present embodiment includes the drain electrode DE made of LTPS in which impurities are injected, the inorganic insulating film 52 that is an upper layer overlying the drain electrode DE, the back gate electrode BG that is an upper layer overlying the inorganic insulating film 52, the inorganic insulating film 53 that is an upper layer overlying the back gate electrode BG, the oxide semiconductor layer 11 that is an upper layer overlying the inorganic insulating film 53, the inorganic insulating film 12 that is an upper layer overlying the oxide semiconductor layer 11, the gate electrode GE (top gate electrode) that is an upper layer overlying the inorganic insulating film 12, the inorganic insulating film 14 that is an upper layer overlying the gate electrode GE, the inorganic insulating film 15 that is an upper layer overlying the inorganic insulating film 14, and the source electrode SE that is an upper layer overlying the inorganic insulating film 15. Note that the electrode E1 may be included in the TFT 10 or may not be included in the TFT 10. The electrode E1 is electrically connected to the drain electrode DE via a contact hole CH6 that extends through the inorganic insulating films 14 and 15 and reaches the drain electrode DE. Further, although not illustrated in the drawings, a TFT 50 including a semiconductor layer 51 made of LTPS may be further provided on the support body 1 also in the present embodiment similarly to the third embodiment.

The TFT 10 according to the present embodiment is different from the TFT 10 and the TFT 50 according to the third embodiment in points that the drain electrode DE made of LTPS in which impurities are injected is formed in a lower layer of the inorganic insulating film 52, slits 52a and 53a are formed in the inorganic insulating films 52 and 53 between the drain electrode DE and the oxide semiconductor layer 11, and a conductive region 11B in the oxide semiconductor layer 11 is connected to the drain electrode DE via the slits 52a and 53a. In the present embodiment, for example, LTPS formed in the same layer as the semiconductor layer 51 of the TFT 50 in the third embodiment can be used for the drain electrode DE.

In other words, for example, a polysilicon film used for the drain electrode DE according to the present embodiment can be simultaneously patterned when a polysilicon film is formed and then patterned in the third embodiment, and impurities can be simultaneously injected when impurities are injected into the semiconductor layer 51 formed of the polysilicon film in the third embodiment. In other words, the drain electrode DE according to the present embodiment can be formed simultaneously with the high-concentration impurity injection regions 51A and 51B by the same method as the formation method of the high-concentration impurity injection regions 51A and 51B in the third embodiment.

Figure 16:
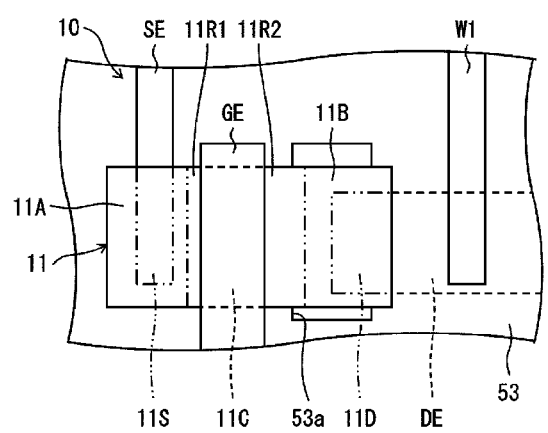
FIG. 16 is a plan view illustrating a schematic configuration of main portions of a TFT according to the fourth embodiment of the disclosure.

Note that, in the examples illustrated in FIGS. 15 and 16, the slits 52a and 53a are provided in the inorganic insulating films 52 and 53 so as to surround a part of the conductive region 11B in the plan view. The oxide semiconductor layer 11 is formed in an island shape extending across the slits 52a and 53a. Each part of opening end faces of the slits 52a and 53a facing each other is covered with a part of the oxide semiconductor layer 11. The oxide semiconductor layer 11 is provided with one of end portions of the oxide semiconductor layer 11 and the other end portion facing the one end portion on the inorganic insulating film 53 so as to interpose the slits 52a and 53a therebetween. Thus, two step portions are formed in the oxide semiconductor layer 11 along step portions of the inorganic insulating film 53 by the slits 52a and 53a. In the present embodiment, a resistive region 11R2 is provided in a portion of the oxide semiconductor layer 11 that covers an opening end face of the slits 52a and 53a on the side closer to a channel region 11C, and the conductive region 11B is provided in a portion of the oxide semiconductor layer 11 that covers an opening end face of the slits 52a and 53a on the side farther from the channel region 11C.

However, the present embodiment is not limited to this, and the slits 52a and 53a may be provided in the inorganic insulating films 52 and 53 so as to surround the entire conductive region 11B in the plan view by changing a shape of the mask used for etching the oxide semiconductor layer 11. In other words, the oxide semiconductor layer 11 may have an island shape that covers a part of the opening end face of the slits 52a and 53a, and the oxide semiconductor layer 11 may be formed such that one of end portions is located on the inorganic insulating film 53 and the other end portion is located inside the slits 52a and 53a. The oxide semiconductor layer 11 may include a step portion formed in a step shape from the top of the inorganic insulating film 53 into the slits 52a and 53a along one step portion of the inorganic insulating films 52 and 53 by the slits 52a and 53a.

The TFT 10 according to the present embodiment can be manufactured by, for example, forming the drain electrode DE simultaneously with the high-concentration impurity injection regions 51A and 51B in the same layer as the high-concentration impurity injection regions 51A and 51B in the third embodiment, forming the slits 52a and 53a in the inorganic insulating films 52 and 53 by using the same mask as the mask used for the formation of the slit 53a when the slit 53a is formed in the inorganic insulating film 53, and forming the oxide semiconductor layer 11 in, for example, an island shape extending across the slits 52a and 53a in a process for patterning the oxide semiconductor layer 11.

Note that, in the TFT 10, the drain electrode DE may be electrically connected to the electrode E1 provided in the same layer as the source electrode SE by forming the contact hole CH6 instead of the contact hole CH2 formed in the first to third embodiments, and forming the electrode E1 instead of the drain electrode DE when a metal film (not illustrated) is film-formed and patterned on, for example, the inorganic insulating film 15. In the TFT 10, an electrode provided in a layer different from the source electrode SE (for example, an upper layer of the source electrode) may also be electrically connected to the drain electrode described above via a contact hole (not illustrated).

Advantageous Effects

The present embodiment can also provide similar advantageous effects to those of the first embodiment or the third embodiment. Further, according to the present embodiment, a polysilicon film in which impurities are injected can be used as the drain electrode DE, and the slits 52a and 53a of the inorganic insulating films 52 and 53 are provided so as to surround at least a part of the conductive region 11B (in the present embodiment, a part of the conductive region 11B). Thus, the slits 52a and 53a are formed in at least a part of a portion that overlaps the inorganic insulating films 52 and 53. Thus, the slits 52a and 53a can be used for electrical connection between the conductive region 11B and the drain electrode DE.

Further, according to the present embodiment, the resistive region 11R2 is provided on the portion of the oxide semiconductor layer 11 that covers the opening end face of the slits 52a and 53a constituting the step portion. Thus, in the present embodiment, the resistive region 11R2 of the step portion described above is emphasized and illustrated, but also in the present embodiment, similarly to the third embodiment, the resistive region 11R2 can be provided in the height direction. Thus, also in the present embodiment, space saving of the TFT 10 can be achieved as compared to the first and second embodiments.

Fifth Embodiment

A description will be given of yet another embodiment of the disclosure with reference to FIG. 17 to (a) to (e) of FIG. 20. Note that the present embodiment will be described in terms of the differences between the present embodiment and the first to fourth embodiments, and components having the same function as the components described in the first to fourth embodiments are assigned the same reference signs, and a description thereof is omitted.

Schematic Configuration of TFT 10 and TFT Substrate 5

Figure 17:
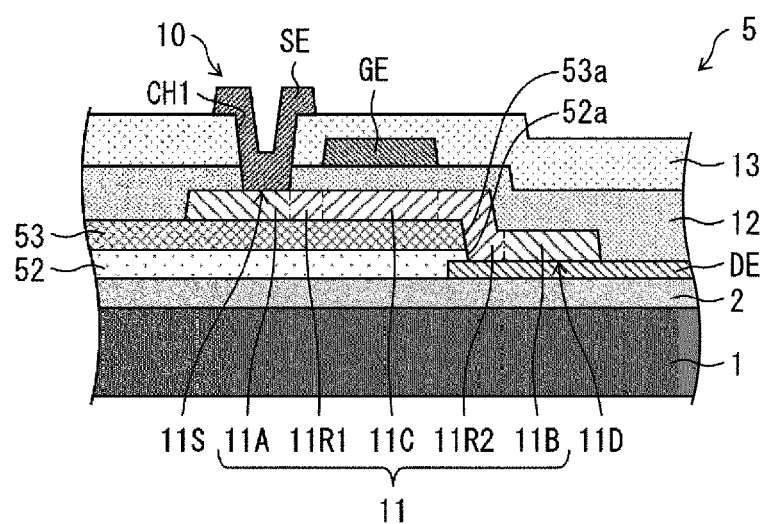
FIG. 17 is a cross-sectional view illustrating a schematic configuration of a TFT according to a fifth embodiment of the disclosure.
Figure 18:
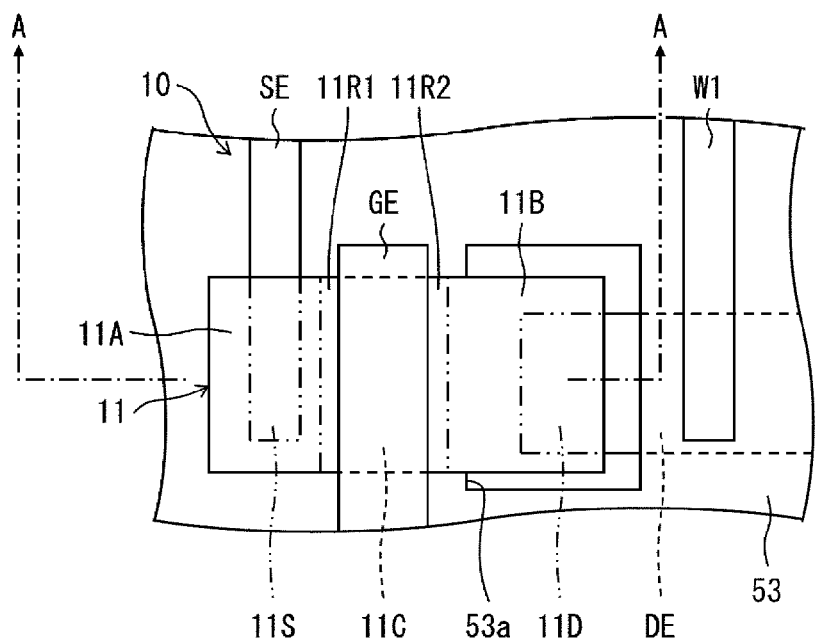
FIG. 18 is a plan view illustrating a schematic configuration of main portions of the TFT according to the fifth embodiment of the disclosure.

FIG. 17 is a cross-sectional view illustrating a schematic configuration of main portions of a TFT substrate 5 according to the present embodiment. FIG. 18 is a plan view illustrating a schematic configuration of main portions of a TFT 10 according to the present embodiment. Note that FIG. 18 illustrates only an oxide semiconductor layer 11, a gate electrode GE, a source electrode SE, a drain electrode DE, an inorganic insulating film 53, and a wiring line W1. FIG. 17 illustrates a cross section of the TFT 10 when the TFT 10 is cut along the A-A line illustrated in FIG. 18.

The TFT substrate 5 according to the present embodiment has a configuration in which an inorganic insulating film 2, the drain electrode DE made of LTPS in which impurities are injected, an inorganic insulating film 52, the inorganic insulating film 53, the oxide semiconductor layer 11, an inorganic insulating film 12, the gate electrode GE, an inorganic insulating film 13, the source electrode SE are layered in this order on a support body 1.

The TFT 10 according to the present embodiment includes the drain electrode DE made of LTPS in which impurities are injected, the inorganic insulating film 52 that is an upper layer overlying the drain electrode DE, the inorganic insulating film 53 that is an upper layer overlying the inorganic insulating film 52, the oxide semiconductor layer 11 that is an upper layer overlying the inorganic insulating film 53, the inorganic insulating film 12 that is an upper layer overlying the oxide semiconductor layer 11, the gate electrode GE (top gate electrode) that is an upper layer overlying the inorganic insulating film 12, the inorganic insulating film 13 that is an upper layer overlying the gate electrode GE, and the source electrode SE that is an upper layer overlying the inorganic insulating film 13.

The inorganic insulating film 13 is formed of a silicon nitride film such as $SiN_x$ and SiNO. Note that, also in the present embodiment, similarly to the fourth embodiment, the electrode E1 may be included in the TFT 10 or may not be included in the TFT 10. Further, although not illustrated in the drawings, also in the present embodiment, similarly to the third embodiment, a TFT 50 including a semiconductor layer 51 made of LTPS may be further provided on the support body 1, and a back gate electrode BG may be disposed and face the gate electrode GE between the inorganic insulating film 52 and the inorganic insulating film 53 with the oxide semiconductor layer 11 and the inorganic insulating films 12 and 53 interposed therebetween so as to overlap the channel region 11C.

As illustrated in FIGS. 17 and 18, in the present embodiment, the inorganic insulating films 52 and 53 formed of a silicon oxide film such as $SiO_2$ are provided as an underlayer in a lower layer of the oxide semiconductor layer 11. Slits 52a and 53a having a tapered opening end face are provided in the inorganic insulating films 52 and 53 so as to surround a conductive region 11B in the plan view. In this way, the inorganic insulating films 52 and 53 include a step portion by the slits 52a and 53a.

The oxide semiconductor layer 11 is formed in an island shape covering a part of the opening end face of the slits 52a and 53a. The oxide semiconductor layer 11 is formed in a step shape from the top of the inorganic insulating film 53 into the slits 52a and 53a of the inorganic insulating films 52 and 53. Thus, the oxide semiconductor layer 11 includes a step portion along one step portion of the inorganic insulating films 52 and 53 by the slits 52a and 53a. In the present embodiment, a resistive region 11R2 is provided in the step portion of the oxide semiconductor layer 11 (in other words, a portion of the oxide semiconductor layer 11 that covers the opening end face of the slits 52a and 53a).

Further, in the TUFT 10 according to the present embodiment, the inorganic insulating film 12 (gate insulating film) is formed in a solid-like form covering the oxide semiconductor layer 11. The inorganic insulating film 12 has a region formed from an end portion of a channel region 11C to a portion overlapping an end portion of the slits 52a and 53a. A region of the oxide semiconductor layer 11 that contacts the region described above is the resistive region 11R2. A region of the oxide semiconductor layer 11 in the slits 52a and 53a that does not overlap the resistive region 11R2 is the conductive region 11B. Note that, when the resistive region 11R2 overlaps the end portion of the slits 52a and 53a described above (in other words, a lower end of the opening end face of the slits 52a and 53a), a boundary portion between the resistive region 11R2 and the conductive region 11B may be located at the end portion of the slits 52a and 53a described above, or may be located slightly offset from the end portion described above to the inside of the slits 52a and 53a.

Manufacturing Method of TFT 10

Figure 19:
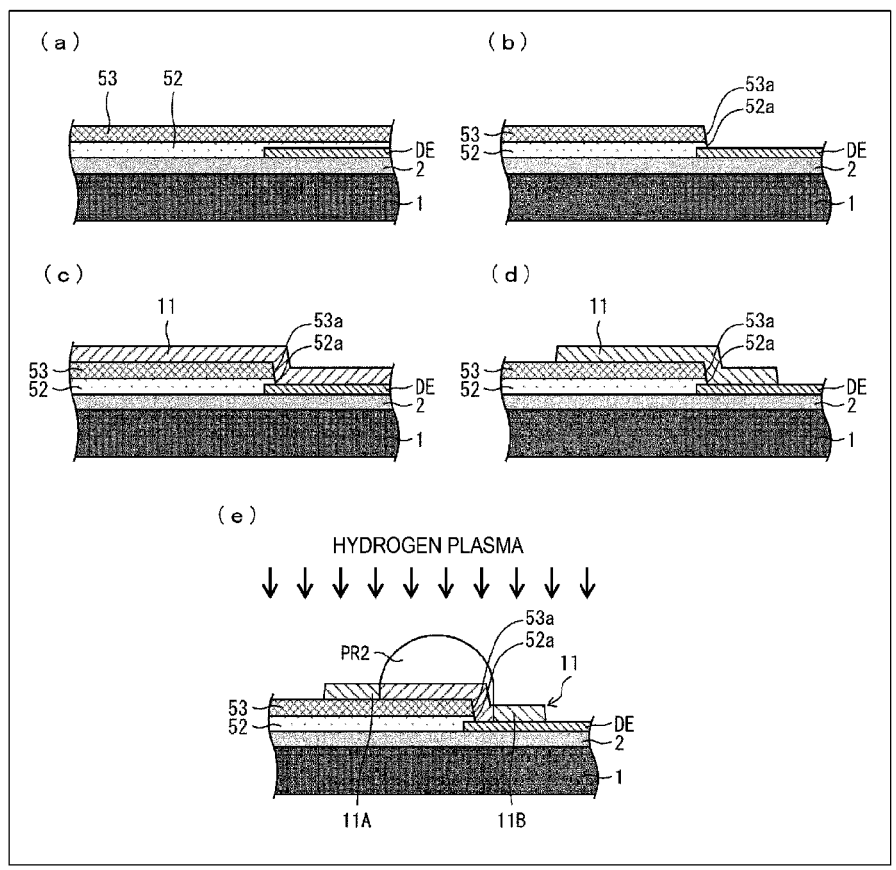
FIGS. 19(a) to 19(e) are cross-sectional views illustrating a sequence of processes for manufacturing the TFT according to the fifth embodiment of the disclosure.

(a) to (e) of FIG. 19 are cross-sectional views illustrating a sequence of processes for manufacturing the TFT 10 according to the present embodiment. (a) to (e) of FIG. 20 are cross-sectional views illustrating a sequence of processes for manufacturing the TFT 10 according to the present embodiment, performed after the processes illustrated in (a) to (e) of FIG. 19. Note that (a) to (e) of FIG. 19 and (a) to (e) of FIG. 20 illustrate a cross section of the TFT 10 when the TFT 10 is cut along the A-A line illustrated in FIG. 18. Further, in the following description, a material and a film formation method for each layer are the same as the material and the film formation method described in the first to fourth embodiments unless stated otherwise.

In the present embodiment, the process up to the process illustrated in (a) of FIG. 19 is the same as the process up to film formation of the solid-like inorganic insulating film 53 on the inorganic insulating film 52 in the fourth embodiment. Also in the present embodiment, similarly to the fourth embodiment, the drain electrode DE formed of a polysilicon film in which impurities are injected is formed on the inorganic insulating film 2 film-formed on the support body 1 (or on the support body 1). The drain electrode DE described above can be formed by film-forming, for example, an amorphous silicon film in a solid-like form on the inorganic insulating film 2 film-formed on the support body 1 (or on the support body 1), irradiating the amorphous silicon film with excimer laser light, thus making the amorphous silicon film polycrystalline to form a polysilicon film, then patterning the polysilicon film, and injecting impurities into the polysilicon film.

Note that, also in the present embodiment, the drain electrode DE described above can be formed simultaneously with the high-concentration impurity injection regions 51A and 51B in the same layer as the high-concentration impurity injection regions 51A and 51B in the third embodiment.

Subsequently, similarly to the third embodiment, the inorganic insulating films 52 and 53 formed of a silicon oxide film such as $SiO_2$ are film-formed in a solid-like form on the inorganic insulating film 2 to cover the drain electrode DE. Note that, as described in the third embodiment, for example, a process for forming the gate electrode GE' in the TFT 50 and the like are performed between a process for forming the inorganic insulating film 52 and a process for forming the inorganic insulating film 53.

Next, as illustrated in (b) of FIG. 19, the inorganic insulating films 52 and 53 are, for example, dry etched by using a mask (not illustrated), and the mask described above is removed, thereby forming the slits 52a and 53a having a tapered opening end face in the inorganic insulating films 52 and 53 such that a part of the drain electrode DE is exposed.

Next, as illustrated in (c) of FIG. 19, the oxide semiconductor layer 11 is film-formed in a solid-like form on the inorganic insulating films 52 and 53 and on the drain electrode DE and the inorganic insulating film 2 that are exposed from the slits 52a and 53a.

Subsequently, the oxide semiconductor layer 11 is patterned by, for example, performing wet etching by using a mask formed of a photoresist (not illustrated), and then the mask described above is removed. In this way, as illustrated in (d) of FIG. 19, the oxide semiconductor layer 11 in an island shape that is provided in a step shape from the top of the inorganic insulating film 53 into the slits 52a and 53a of the inorganic insulating films 52 and 53 is formed. A part of the above-described oxide semiconductor layer 11 formed in this manner covers a part of the opening end face of the slits 52a and 53a and reaches the inside of the slits 52a and 53a. Thus, a step portion along one step portion of the inorganic insulating films 52 and 53 by the slits 52a and 53a is formed in the oxide semiconductor layer 11.

Next, as illustrated in (e) of FIG. 19, a photoresist PR2 is formed as a hydrogen blocking layer in a region on the oxide semiconductor layer 11 located above the opening end of the slits 52a and 53a of the inorganic insulating films 52 and 53 (in other words, a region that becomes a channel region 11C, a resistive region 11R1, and the resistive region 11R2 illustrated in FIG. 17) so as to cover the step portion of the oxide semiconductor layer 11.

Then, the oxide semiconductor layer 11 is irradiated with hydrogen plasma from above the photoresist PR2 with the photoresist PR2 as a mask. In this way, similarly to the first embodiment, an exposed portion of the oxide semiconductor layer 11 being exposed from the photoresist PR2 is exposed to hydrogen radicals in the hydrogen plasma, and thus becomes conductive regions 11A and 11B. Note that the region on the oxide semiconductor layer 11 covered with the photoresist PR2 is maintained in a state of high resistance as an oxide semiconductor region.

Figure 20:
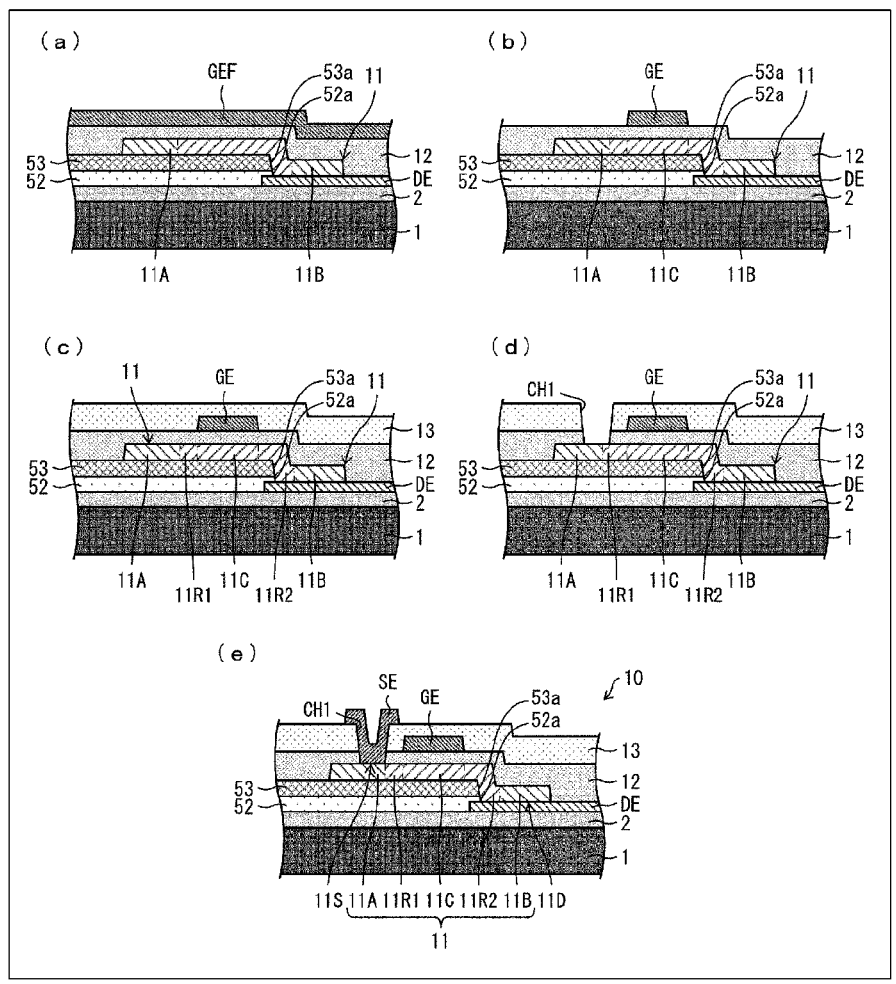
FIGS. 20(a) to 20(e) are cross-sectional views illustrating a sequence of processes for manufacturing the TFT according to the fifth embodiment of the disclosure, performed after the processes illustrated in (a) to (e) of FIG. 19.

Next, as illustrated in (a) of FIG. 20, the photoresist PR2 is removed, and the inorganic insulating film 12 serving as a gate insulating film is film-formed in a solid-like form on the inorganic insulating films 52 and 53 so as to cover the oxide semiconductor layer 11 described above, and the drain electrode DE and the inorganic insulating film 2 that are exposed from the slits 52a and 53a. Subsequently, a metal film GEF used for the gate electrode GE is film-formed in a solid-like form on the inorganic insulating film 12.

Next, as illustrated in (b) of FIG. 20, the metal film GEF is patterned by performing, for example, dry etching by using a mask formed of a photoresist (not illustrated), and then the mask described above is removed. In this way, the gate electrode GE in an island shape formed of the metal film GEF is formed above a part of the oxide semiconductor region between the conductive regions 11A and 11B in the oxide semiconductor layer 11 described above. A region of the oxide semiconductor region in the oxide semiconductor layer 11 described above that overlaps the gate electrode GE functions as the channel region 11C.

Next, as illustrated in (c) of FIG. 20, the inorganic insulating film 13 formed of a silicon nitride film is formed (film-formed) in a solid-like form on the inorganic insulating film 12 so as to cover the gate electrode GE described above.

Next, as illustrated in (d) of FIG. 20, the contact hole CH1 that extends through the inorganic insulating films 12 and 13 and reaches the conductive region 11A is formed in the inorganic insulating films 12 and 13. Further, at this time, for example, a contact hole (not illustrated) that extends through the inorganic insulating films 12 and 13 and reaches the conductive region 11B is formed together.

Subsequently, a metal film (not illustrated) is film-formed on the inorganic insulating film 13, and the metal film is patterned, thereby forming the source electrode SE electrically connected to a part of the conductive region 11A (source region 11S) via the contact hole CH1, as illustrated in (e) of FIG. 20. At this time, even when the contact hole CH1 is offset from the conductive region 11A as illustrated in (d) of FIG. 20, the source electrode SE is made of metal, and thus, as illustrated in (e) of FIG. 20, the oxide semiconductor layer 11 directly below the source electrode SE (for example, the resistive region 11R1 that contacts the source electrode SE) is made conductive and becomes the conductive region 11A (source region 11S). On the other hand, since the drain electrode DE is formed of a polysilicon film and is not a metal, the resistive region 11R2 is not made conductive by contacting the drain electrode DE. Note that the same also applies to the TFT 10 according to the first to fourth embodiments in this point. Then, the region of the oxide semiconductor layer 11 between the conductive region 11A described above and the channel region 11C overlapping the gate electrode GE becomes the resistive region 11R1.

In addition, in the present embodiment, the region of the conductive region 11B in the slits 52a and 53a that contacts the drain electrode DE is a drain region 11D, and the drain region 11D functions as the drain electrode DE, for example. Then, the region of the oxide semiconductor layer 11 between the conductive region 11B described above and the channel region 11C overlapping the gate electrode GE becomes the resistive region 11R2.

In the processes described above, the TFT 10 according to the present embodiment is formed. In addition, although not illustrated in the drawings, also in the present embodiment, the TFT substrate 5 including the TFT 10 described above is formed by forming a flattening film 3 on the inorganic insulating film 13 so as to cover the TFT 10 described above.

Advantageous Effects

The present embodiment can also provide similar advantageous effects to those of the first embodiment, and can also provide similar advantageous effects to those of the third and fourth embodiments. In other words, also in the present embodiment, the resistive region 11R2 in the height direction is provided on the step portion of the oxide semiconductor layer 11, and thus space saving of the TFT 10 can be achieved as compared to the first and second embodiments. Further, according to the present embodiment, in addition to the advantageous effects described above, an advantageous effect in which the resistive regions 11R1 and 11R2 can be formed between the channel region 11C and the conductive regions 11A and 11B in the oxide semiconductor layer 11 without forming the inorganic insulating film 12 in an island shape can be obtained. Further, according to the present embodiment, a polysilicon film in which impurities are injected can be used as the drain electrode DE, and the slits 52a and 53a of the inorganic insulating films 52 and 53 are provided so as to surround at least a part of the conductive region 11B (in the present embodiment, the entire conductive region 11B). Thus, the slits 52a and 53a are formed in at least a part of a portion that overlaps the inorganic insulating films 52 and 53. Thus, the slits 52a and 53a can be used for electrical connection between the conductive region 11B and the drain electrode DE.

Modified Example 1

In the present embodiment, as described above, the case in which the resistive regions 11R1 and 11R2 are formed by forming the inorganic insulating film 12 in a solid-like form and irradiating the oxide semiconductor layer 11 with hydrogen plasma by using the photoresist PR2 is described as an example. In this case, similarly to the first embodiment, the formation of the resistive regions 11R1 and 11R2 can be finely controlled. However, the present embodiment is not limited to this example. Also in the present embodiment, as described in the second embodiment, the resistive regions 11R1 and 11R2 may be formed by forming a portion of the inorganic insulating film 12 that overlaps the oxide semiconductor layer 11 in an island shape smaller than the oxide semiconductor layer 11 and larger than the gate electrode GE so as to correspond to a region that becomes the channel region 11C and the resistive regions 11R1 and 11R2, and forming the inorganic insulating film 13 with a silicon nitride film. At this time, a region of the inorganic insulating film 12 from a boundary portion with the channel region 11C to a portion overlapping the end portion of the slits 52a and 53a is the resistive region 11R2, and a region in the slits 52a and 53a that does not overlap the resistive region 11R2 is the conductive region 11B being made conductive by contacting the inorganic insulating film 13. In other words, in this case, the resistive regions 11R1 and 11R2 and the channel region 11C are a region that overlaps and contacts the inorganic insulating film 12, and the conductive regions 11A and 11B are a region that does not overlap the inorganic insulating film 12 and contacts any of the inorganic insulating film 13, the source electrode SE, and the drain electrode DE. In this way, the same advantageous effects as those of the second embodiment can be obtained.

Note that, also in the following embodiment, as an example of a manufacturing method of the TFT 10, a case in which a resistive region is formed by forming the inorganic insulating film 12 in a solid-like form and irradiating the oxide semiconductor layer 11 with hydrogen plasma by using a photoresist will be described as an example. However, also in the following embodiment, the same advantageous effects as those of the second embodiment can be obtained by forming the inorganic insulating film 12 in an island shape having the size corresponding to a region that becomes a channel region and a resistive region, and forming the inorganic insulating film 13 with a silicon nitride film.

Modified Example 2

Further, in the present embodiment, the case in which the slits 52a and 53a are provided in the inorganic insulating films 52 and 53 so as to surround the conductive region 11B in the plan view is described as an example. However, the present embodiment is not limited to this example. In the TFT 10 described above, the conductive region 11A of the oxide semiconductor layer 11 may be provided in the slits 52a and 53a by providing the slits 52a and 53a so as to surround the conductive region 11A. In addition, in the TFT 10 described above, the conductive regions 11A and 11B of the oxide semiconductor layer 11 may be provided in the respective slits 52a and 53a by providing the slits 52a and 53a so as to surround the conductive region 11A and the conductive region 11B, respectively. The slits 52a and 53a are provided in the inorganic insulating films 52 and 53 so as to each surround at least one of the conductive region 11A and the conductive region 11B in the plan view. Thus, at least one of the resistive regions 11R1 and 11R2 can be formed by using the step portion of the oxide semiconductor layer 11 formed by the slits 52a and 53a. Thus, space saving of the TFT 10 can be achieved.

Sixth Embodiment

A description will be given of yet another embodiment of the disclosure with reference to FIG. 21 and (a) to (d) of FIG. 22. Note that the present embodiment will be described in terms of the differences between the present embodiment and the first to fifth embodiments, and components having the same function as the components described in the first to fifth embodiments are assigned the same reference signs, and a description thereof will be omitted.

Schematic Configuration of TFT 10

Figure 21:
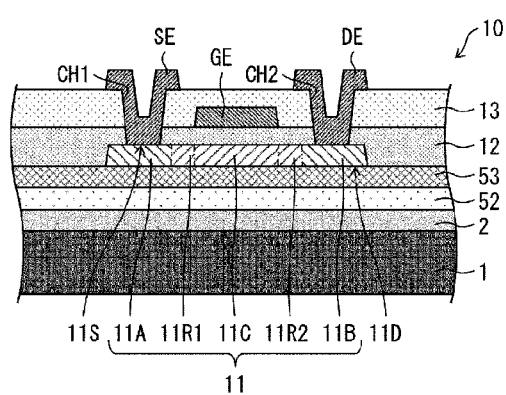
FIG. 21 is a cross-sectional view illustrating a schematic configuration of a TFT according to a sixth embodiment of the disclosure.

FIG. 21 is a cross-sectional view illustrating a schematic configuration of a TFT 10 according to the present embodiment.

As illustrated in FIG. 21, the TFT 10 according to the present embodiment includes an inorganic insulating film 12 (gate insulating film) formed in a solid-like form covering an oxide semiconductor layer 11 similarly to the fifth embodiment, and is also the same as the TFT 10 according to the third embodiment except for a point that, instead of the inorganic insulating films 14 and 15, a solid-like inorganic insulating film 13 formed of a silicon nitride film such as SiN$_x$ and SiNO is formed on a gate electrode GE so as to be adjacent to the gate electrode GE and the inorganic insulating film 12, and a point that the slit 53a is not provided in an inorganic insulating film 53. Note that, although not illustrated in the drawings, also in the present embodiment, similarly to the third embodiment, a TFT 50 including a semiconductor layer 51 made of LTPS may be further provided on a support body 1, and a back gate electrode BG may be disposed and face the gate electrode GE between an inorganic insulating film 52 and the inorganic insulating film 53 with the oxide semiconductor layer 11 and the inorganic insulating films 12 and 53 interposed therebetween so as to overlap a channel region 11C.

Manufacturing Method of TFT 10

Figure 22:
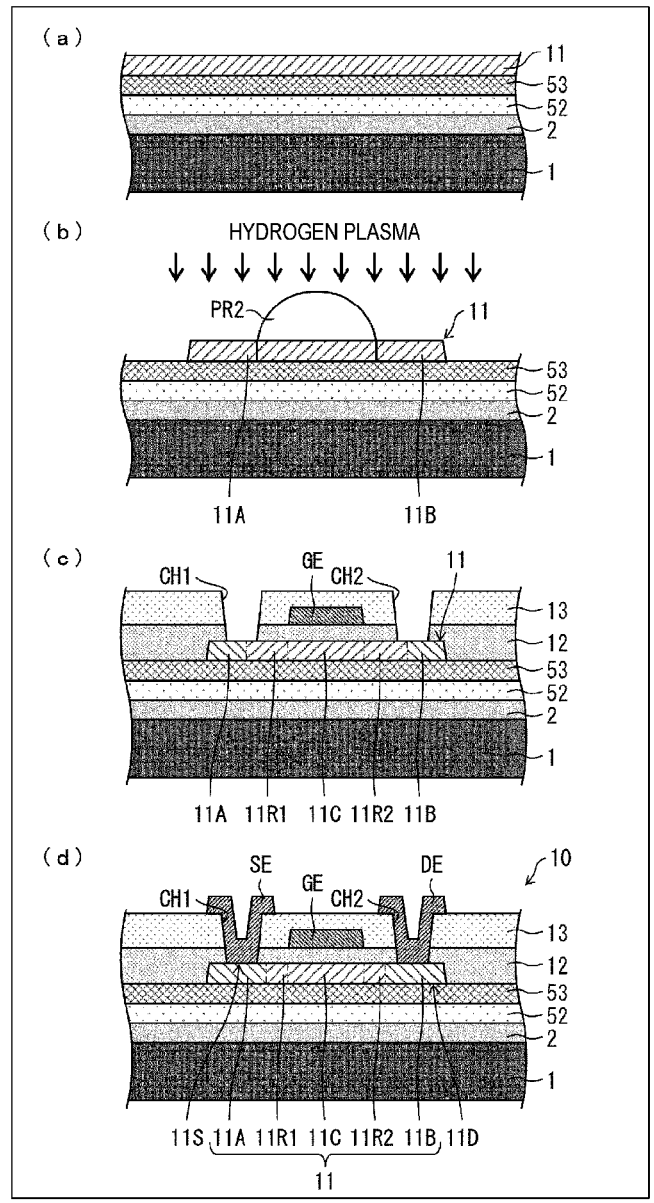
FIGS. 22(a) to 22(d) are cross-sectional views illustrating a sequence of processes for manufacturing the TFT according to the sixth embodiment of the disclosure.

(a) to (d) of FIG. 22 are cross-sectional views illustrating a sequence of processes for manufacturing the TFT 10 according to the present embodiment. Note that, in the following description, a material and a film formation method for each layer are the same as the material and the film formation method described in the first to fifth embodiments unless stated otherwise.

In (a) of FIG. 22, a process up to film-formation of the inorganic insulating film 53 in a solid-like form on the inorganic insulating film 52 is the same process up to film formation of the inorganic insulating film 53 in a solid-like form on the inorganic insulating film 52 in the fourth embodiment. In the present embodiment, as illustrated in (a) of FIG. 22, after the film formation of the inorganic insulating films 52 and 53, the oxide semiconductor layer 11 is formed in a solid-like form on the inorganic insulating films 52 and 53 described above similarly to the process for film-forming the oxide semiconductor layer 11 illustrated in (a) of FIG. 3.

Subsequently, as illustrated in (b) of FIG. 22, the oxide semiconductor layer 11 in an island shape is formed similarly to the process illustrated in (b) of FIG. 3. Next, as illustrated in (b) of FIG. 22, a photoresist PR2 covering a region that becomes the channel region 11C and resistive regions 11R1 and 11R2 is formed on a part (center portion) of the above-described oxide semiconductor layer 11 in the island shape. Then, the oxide semiconductor layer 11 is irradiated with hydrogen plasma from above the photoresist PR2 with the photoresist PR2 as a mask. In this way, similarly to the fifth embodiment, an exposed portion of the oxide semiconductor layer 11 being exposed from the photoresist PR2 becomes conductive regions 11A and 11B.

Next, similarly to the processes illustrated in (a) to (c) of FIG. 20, as illustrated in (c) of FIG. 22, the inorganic insulating film 12 (gate insulating film) in a solid-like form covering the oxide semiconductor layer 11, the gate electrode GE in an island shape located above a part of an oxide semiconductor region between the conductive regions 114 and 11B in the oxide semiconductor layer 11, the inorganic insulating film 13 in a solid-like form formed of a silicon nitride film are formed in this order on the inorganic insulating film 53. Note that, also in the present embodiment, a region of the oxide semiconductor region in the oxide semiconductor layer 11 that overlaps the gate electrode GE functions as the channel region 11C. Next, as illustrated in (c) of FIG. 22, a contact hole CH1 that extends through the inorganic insulating films 12 and 13 and reaches the conductive region 11A, and a contact hole CH2 that extends through the inorganic insulating films 12 and 13 and reaches the conductive region 11B are each formed with the gate electrode GE interposed therebetween.

Subsequently, a metal film (not illustrated) is film-formed and patterned on the inorganic insulating film 13, thereby forming, as illustrated in (d) of FIG. 22, a source electrode SE electrically connected to a part of the conductive region 11A (source region 11S) via the contact hole CH1, and the drain electrode DE electrically connected to a part of the conductive region 11B (drain region 11D) via the contact hole CH2. Note that, also in the present embodiment, as illustrated in (c) of FIG. 22, even when the contact holes CH1 and CH2 are offset from the conductive regions 11A and 11B, the source electrode SE and the drain electrode DE are made of metal. Thus, as illustrated in (d) of FIG. 22, the oxide semiconductor layer 11 directly below the source electrode SE (for example, the resistive region 11R1 that contacts the source electrode SE) is made conductive and becomes the conductive region 11A (source region 11S), and the oxide semiconductor layer 11 directly below the drain electrode DE (for example, the resistive region 11R2 that contacts the drain electrode DE) is made conductive and becomes the conductive region 11B (drain region 11D). Then, a region between the conductive region 11A described above and the channel region 11C overlapping the gate electrode GE in the oxide semiconductor layer 11 becomes the resistive region 11R1, and a region between the conductive region 11B described above and the channel region 11C overlapping the gate electrode GE becomes the resistive region 11R2.

In the processes described above, the TFT 10 according to the present embodiment is formed. In addition, although not illustrated in the drawings, a TFT substrate 5 including the TFT 10 described above is formed by forming a flattening film 3 on the inorganic insulating film 13 so as to cover the TFT 10 described above.

Advantageous Effects

The present embodiment can provide the same advantageous effects as those of the first embodiment, for example, and, similarly to the fifth embodiment, the resistive regions 11R1 and 11R2 can be formed between the channel region 11C and the conductive regions 11A and 11B in the oxide semiconductor layer 11 without forming the inorganic insulating film 12 in an island shape.

Seventh Embodiment

A description will be given of yet another embodiment of the present disclosure with reference to FIG. 23 to (a) to (d) of FIG. 25. Note that the present embodiment will be described in terms of the differences between the present embodiment and the first to sixth embodiments, and components having the same function as the components described in the first to sixth embodiments are assigned the same reference signs, and a description thereof will be omitted.

Schematic Configuration of TFT 10

Figure 23:
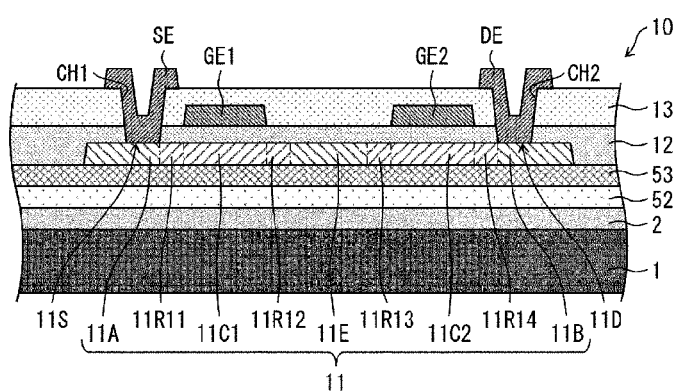
FIG. 23 is a cross-sectional view illustrating a schematic configuration of a TFT according to a seventh embodiment of the disclosure.
Figure 24:
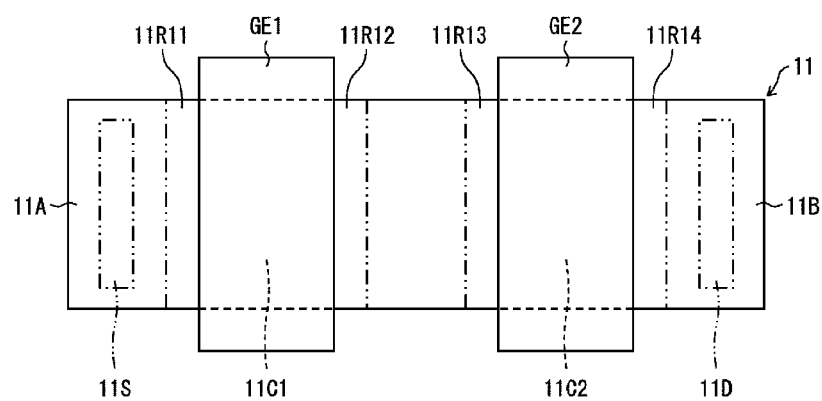
FIG. 24 is a plan view illustrating a schematic configuration of main portions of the TFT according to the seventh embodiment of the disclosure.

FIG. 23 is a cross-sectional view illustrating a schematic configuration of a TFT 10 according to the present embodiment. FIG. 24 is a plan view illustrating a schematic configuration of main portions of the TFT 10 according to the present embodiment. Note that FIG. 24 illustrates only an oxide semiconductor layer 11 and gate electrodes GE1 and GE2 in the TFT 10 described above.

The TFT 10 according to the present embodiment is the same as the TFT 10 according to the sixth embodiment except for the following points.

As illustrated in FIGS. 23 and 24, the TFT 10 according to the present embodiment is a TFT having a dual gate structure including a double channel.

The TFT 10 according to the present embodiment includes the two gate electrodes GE1 and GE2 between a source electrode SE and a drain electrode DE. Thus, the TFT 10 according to the present embodiment has a structure in which the two gate electrodes GE1 and GE2 are provided side by side above one oxide semiconductor layer 11. The gate electrodes GE1 and GE2 are electrically connected to each other via the oxide semiconductor layer 11.

The oxide semiconductor layer 11 according to the present embodiment includes, as a channel region, a channel region 11C1 (first channel region) and a channel region 11C2 (second channel region) between a conductive region 11A and a conductive region 11B. The channel region 11C1 is a region of the oxide semiconductor layer 11 that is not made conductive and overlaps the gate electrode GE1 (first gate electrode) in a region having a relatively high resistance value (oxide semiconductor region). The channel region 11C2 is a region of the oxide semiconductor layer 11 that is not made conductive and overlaps the gate electrode GE2 (second gate electrode) in a region having a relatively high resistance value (oxide semiconductor region).

A conductive region HE is provided between the channel region 11C1 and the channel region 11C2. A resistivity of the conductive region 11E (third conductive region) is the same as that of the conductive regions 11A and 11B, and the conductive region 11E is formed simultaneously with the conductive region 11A (first conductive region) and the conductive region 11B (second conductive region).

A resistive region 11R11 is provided between the conductive region 11A and the channel region 11C1. A resistive region 11R12 is provided between the channel region 11C1 and the conductive region 11E. A resistive region 11R13 is provided between the conductive region 11E and the channel region 11C2. A resistive region 11R14 is provided between the channel region 11C2 and the conductive region 11B. In other words, in the oxide semiconductor layer 11 according to the present embodiment, the conductive region 11A, the resistive region 11R11, the channel region 11C1, the resistive region 11R12, the conductive region 11E, the resistive region 11R13, the channel region 11C2, the resistive region 11R14, and the conductive region 11B are provided so as to contact an adjacent region in this order from one of end portions of the oxide semiconductor layer 11 (end portion on a side connected to the source electrode SE) toward the other end portion (end portion on a side connected to the drain electrode DE).

Note that the resistive regions 11R11 to 11R14 are regions of the oxide semiconductor layer 11 that are not made conductive and do not overlap the gate electrode GE in a region having a relatively high resistance value (oxide semiconductor region). In the present embodiment, a relatively high resistance value indicates a resistance value higher than that of the conductive regions 11A, 11E, and 11B.

Manufacturing Method of TFT 10

Figure 25:
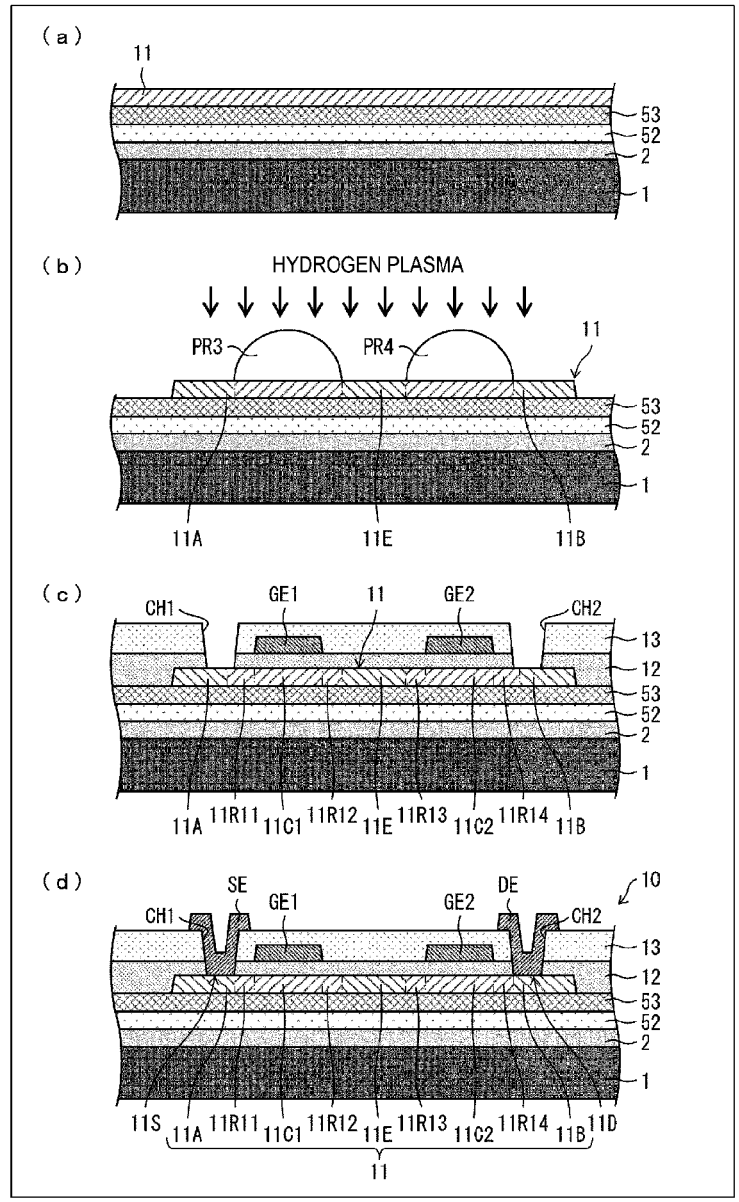
FIGS. 25(a) to 25(d) are cross-sectional views illustrating a sequence of processes for manufacturing the TFT according to the seventh embodiment of the disclosure.

(a) to (d) of FIG. 25 are cross-sectional views illustrating a sequence of processes for manufacturing the TFT 10 according to the present embodiment. Note that, in the following description, a material and a film formation method for each layer are the same as the material and the film formation method described in the first to fourth embodiments unless stated otherwise.

A process illustrated in (a) of FIG. 25 is the same as the process illustrated in (a) of FIG. 22. Further, a process up to formation of the oxide semiconductor layer 11 in an island shape in the process illustrated in (b) of FIG. 25 is the same as the process up to formation of the oxide semiconductor layer 11 in an island shape in the process illustrated in (b) of FIG. 22.

In the present embodiment, as illustrated in (b) of FIG. 25, after the oxide semiconductor layer 11 in an island shape is formed, a photoresist PR3 covering a region that becomes the channel region 11C1 and the resistive regions 11R11 and 11R12 illustrated in FIG. 24 and a photoresist PR4 covering a region that becomes the channel region 11C2 and the resistive regions 11R13 and 11R14 are formed as a hydrogen blocking layer on a part of the above-described oxide semiconductor layer 11 in the island shape.

Then, the oxide semiconductor layer 11 is irradiated with hydrogen plasma from above the photoresists PR3 and PR4 with the photoresists PR3 and PR4 as a mask. In this way, an exposed portion of the oxide semiconductor layer 11 on one of end portion sides being exposed from the photoresists PR3 and PR4 in the oxide semiconductor layer 11 becomes the conductive region 11A, an exposed portion of the oxide semiconductor layer 11 on the other end portion side becomes the conductive region 11B, and an exposed portion between the photoresist PR3 and the photoresist PR4 becomes the conductive region 11E.

Next, as illustrated in (c) of FIG. 25, other than forming the gate electrodes GE1 and GE2 in island shapes on the inorganic insulating film 12, the inorganic insulating film 12 (gate insulating film) in a solid-like form covering the oxide semiconductor layer 11, the gate electrodes GE1 and GE2 in the island shapes, and the inorganic insulating film 13 in a solid-like form formed of a silicon nitride film are formed in this order on the inorganic insulating film 53 similarly to the process illustrated in (c) of FIG. 22. In the present embodiment, in the process for forming the above-described gate electrodes GE1 and GE2 in the island shapes, a shape of a mask formed of a photoresist used for forming the gate electrode GE in the process illustrated in (c) of FIG. 22 is changed. Thus, the gate electrode GE1 in the island shape located above a part of the oxide semiconductor region between the conductive regions 11A and 11E in the oxide semiconductor layer 11, and the gate electrode GE2 in the island shape located above a part of the oxide semiconductor region between the conductive regions 11E and 11B in the oxide semiconductor layer 11 are formed on the inorganic insulating film 12 described above.

Note that, in the present embodiment, of the oxide semiconductor region in the oxide semiconductor layer 11, a region that overlaps the gate electrode GE1 functions as the channel region 11C1, and a region that overlaps the gate electrode GE2 functions as the channel region 11C2. Then, the oxide semiconductor region between the channel region 11C1 and the conductive region 11E functions as the resistive region 11R12, and the oxide semiconductor region between the channel region 11C2 and the conductive region 11E functions as the resistive region 11R13.

Subsequently, similarly to the process illustrated in (c) of FIG. 22, as illustrated in (c) of FIG. 25, contact holes CH1 and CH2 that extend through the inorganic insulating films 12 and 13 and reach the conductive region 11A are each formed with the gate electrodes GE1 and GE2 interposed therebetween.

Next, similarly to the process illustrated in (e) of FIG. 22, as illustrated in (d) of FIG. 25, the source electrode SE electrically connected to a part of the conductive region 11A (source region 11S) via the contact hole CH1 is formed, and the drain electrode DE electrically connected to a part of the conductive region 11B (drain region 11D) via the contact hole CH2 is formed.

Note that, at this time, even when the contact holes CH1 and CH2 are offset from the conductive regions 11A and 11B as illustrated in (c) of FIG. 25, the source electrode SE and the drain electrode DE are made of metal, and thus the oxide semiconductor layer 11 directly below the source electrode SE and the drain electrode DE is made conductive and becomes the conductive regions 11A and 11B as illustrated in (d) of FIG. 25. Then, the region of the oxide semiconductor layer 11 between the conductive region 11A described above and the channel region 11C1 overlapping the gate electrode GE1 becomes the resistive region 11R11. Further, the region of the oxide semiconductor layer 11 between the conductive region 11B described above and the channel region 11C2 overlapping the gate electrode GE2 becomes the resistive region 11R14.

In the processes described above, the TFT 10 according to the present embodiment is formed. In addition, although not illustrated in the drawings, a TFT substrate 5 including the TFT 10 described above is formed by forming a flattening film 3 on the inorganic insulating film 13 so as to cover the TET 10 described above.

Advantageous Effects

According to the present embodiment, by providing be resistive regions 11R11 to 11R14 between the channel regions 11C1 and 11C2 and the conductive regions 11A, 11E, and 11B in the oxide semiconductor layer 11, it is possible to provide the TFT 10 that has a gentle rise in drive voltage in the current-voltage characteristic, has a high S value (subthreshold coefficient), is suitable for a current driving type display device, and has a dual gate structure including a double channel, and a manufacturing method of the TFT 10. Further, by incorporating the TFT 10 described above into a display device (for example, the display device 40), it is possible to provide a display device in a dual gate structure having a gentle rise of a drive voltage in the current-voltage characteristic. The TFT 10 has a dual gate structure, and thus it is possible to provide the TFT 10 that reduces a leakage current and is highly reliable.

Further, according to the present embodiment, similarly to the fifth and sixth embodiments, the resistive regions 11R11 to 11R14 can be formed between the channel regions 11C1 and 11C2 and the conductive regions 11A, 11E, and 11B in the oxide semiconductor layer 11 without forming the inorganic insulating film 12 in an island shape.

Eighth Embodiment

A description will be given of yet another embodiment of the disclosure with reference to FIG. 26 to (a) to (d) of FIG. 28. Note that the present embodiment will be described in terms of the differences between the present embodiment and the first to seventh embodiments, and components having the same function as the components described in the first to seventh embodiments are assigned the same reference signs, and a description thereof will be omitted.

Schematic Configuration of TFT 10

Figure 26:
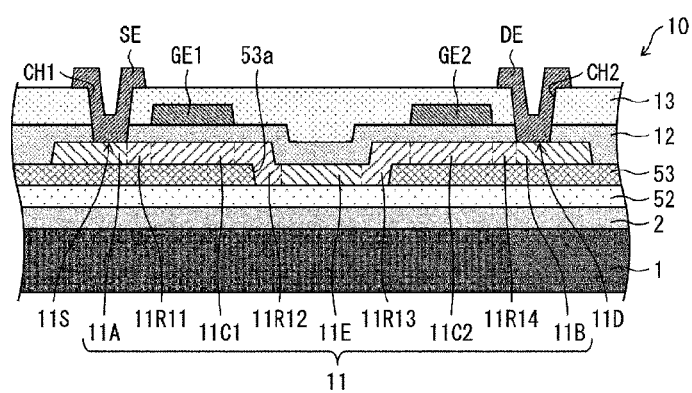
FIG. 26 is a cross-sectional view illustrating a schematic configuration of a TFT according to an eighth embodiment of the disclosure.
Figure 27:
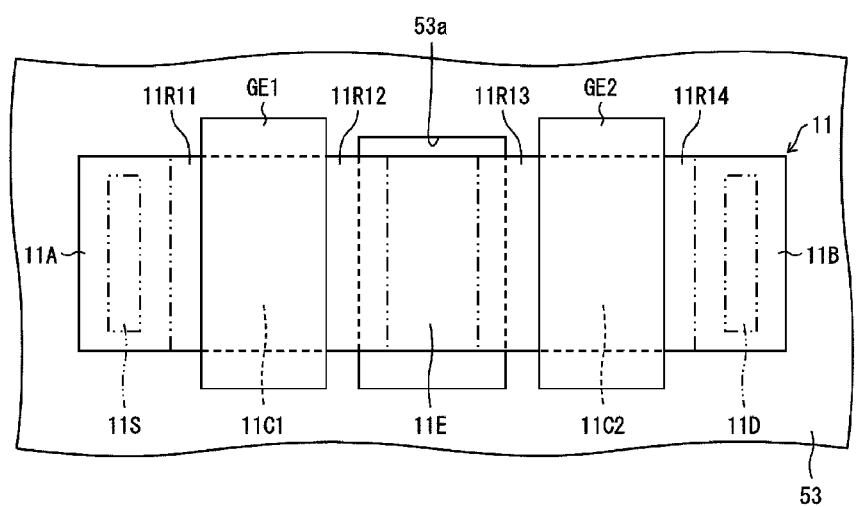
FIG. 27 is a plan view illustrating a schematic configuration of main portions of the TFT according to the eighth embodiment of the disclosure.

FIG. 26 is a cross-sectional view illustrating a schematic configuration of a TFT 10 according to the present embodiment. FIG. 27 is a plan view illustrating a schematic configuration of main portions of the TFT 10 according to the present embodiment. Note that FIG. 27 illustrates only an oxide semiconductor layer 11, gate electrodes GE1 and GE2, and an inorganic insulating film 53 in the TFT 10 described above.

As illustrated in FIGS. 26 and 27, the TFT 10 according to the present embodiment is a TFT having a dual gate structure including a double channel, and is the same as the TFT 10 according to the seventh embodiment except for the following points.

As illustrated in FIGS. 26 and 27, in the TFT 10 according to the present embodiment, a slit 53a having a tapered opening end face is provided in the inorganic insulating film 53 so as to surround a conductive region 11E in the plan view. In this way, the inorganic insulating film 53 includes a step portion formed by the slit 53a.

The oxide semiconductor layer 11 is formed in an island shape extending across the slit 53a. The oxide semiconductor layer 11 is provided with one of end portions of the oxide semiconductor layer 11 and the other end portion facing the one end portion on the inorganic insulating film 53 so as to interpose the slit 53a therebetween. Thus, the oxide semiconductor layer 11 includes a step portion having a recessed shape (in other words, two step portions that are formed in a step shape and face each other). Each part of the opening end faces facing each other in the slit 53a is covered with a part of the oxide semiconductor layer 11.

In the present embodiment, the conductive region 11E is located inside the slit 53a, and a resistive region 11R12 located between the conductive region 11E and a channel region 11C1, and a resistive region 11R13 located between the conductive region 11E and a channel region 11C2 are each provided on the step portion of the oxide semiconductor layer 11 described above (in other words, a portion of the oxide semiconductor layer 11 that covers the opening end faces of the slit 53a). In other words, in the TFT 10 according to the present embodiment, the slit 53a is provided in a portion of the inorganic insulating film 53 between the channel region 11C1 and the channel region 11C2 in the plan view.

Manufacturing Method of TFT 10

Figure 28:
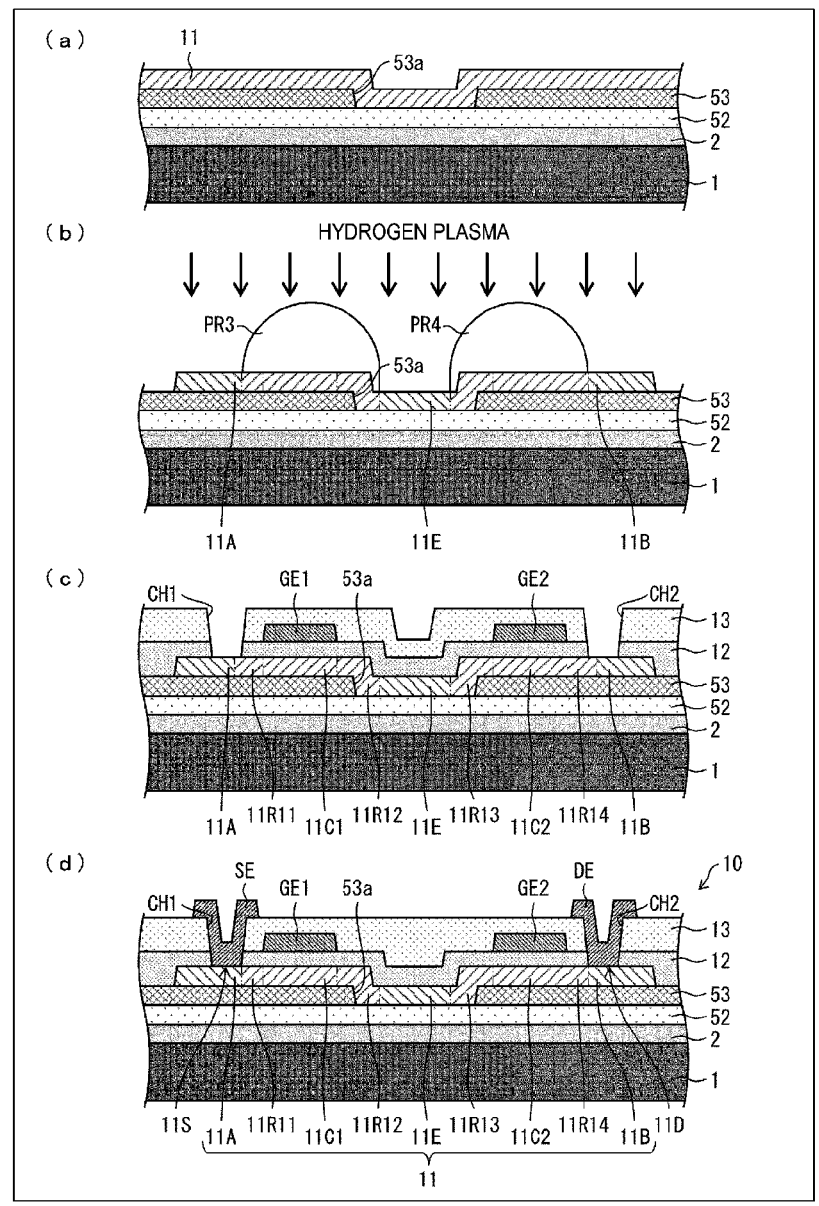
FIGS. 28(a) to 28(d) are cross-sectional views illustrating a sequence of processes for manufacturing the TFT according to the eighth embodiment of the disclosure.

(a) to (d) of FIG. 28 are cross-sectional views illustrating a sequence of processes for manufacturing the TFT 10 according to the present embodiment. Note that, in the following description, a material and a film formation method for each layer are the same as the material and the film formation method described in the first to fifth embodiments unless stated otherwise.

In (a) of FIG. 28, a process up to film formation of the inorganic insulating film 53 in a solid-like form on an inorganic insulating film 52 is the same as the process up to film formation of the inorganic insulating film 53 in a solid-like form on the inorganic insulating film 52, formation of the slit 53a in the inorganic insulating film 53, and film formation of the oxide semiconductor layer 11 in a solid-like form on the inorganic insulating film 53 and the inorganic insulating film 52 exposed from the slit 53a in the third embodiment.

In the present embodiment, after the process illustrated in (a) of FIG. 28, the oxide semiconductor layer 11 is patterned by using a mask formed of a photoresist (not illustrated) as illustrated in (b) of FIG. 28. Thus, each part of the opening end faces facing each other in the slit 53a is covered with a part of the oxide semiconductor layer 11 so as to extend across the slit 53a, and the oxide semiconductor layer 11 in an island shape including a recessed step portion provided with one of end portions of the oxide semiconductor layer 11 and the other end portion facing the one end portion is formed on the inorganic insulating films 52 and 53 with the slit 53a interposed therebetween. In this way, the two step portions along the step portion of the inorganic insulating film 53 by the slit 53a are formed in the oxide semiconductor layer 11.

Next, a photoresist PR3 is formed in a region on the oxide semiconductor layer 11 that is located above one opening end of the slit 53a of the inorganic insulating film 53 (in other words, in a region that becomes the channel region 11C1, a resistive region 11R11, and the resistive region 11R12 illustrated in FIG. 26) so as to cover each step portion of the oxide semiconductor layer 11. Further, a photoresist PR4 is formed in a region on the oxide semiconductor layer 11 that is located above the other opening end facing the one opening end of the slit 53a of the inorganic insulating film 53 (in other words, in a region that becomes the channel region 11C2, the resistive region 11R13, and a resistive region 11R14 illustrated in FIG. 26).

Then, similarly to the process illustrated in (b) of FIG. 25, the oxide semiconductor layer 11 is irradiated with hydrogen plasma from above the photoresists PR3 and PR4 with the photoresists PR3 and PR4 as a mask. In this way, an exposed portion of the oxide semiconductor layer 11 on one of end portion sides being exposed from the photoresists PR3 and PR4 in the oxide semiconductor layer 11 becomes a conductive region 11A, an exposed portion of the oxide semiconductor layer 11 on the other end portion side becomes a conductive region 11B, and an exposed portion between the photoresist PR3 and the photoresist PR4 becomes a conductive region 11E.

Next, similarly to the process illustrated in (c) of FIG. 25, as illustrated in (c) FIG. 28, an inorganic insulating film 12 (gate insulating film) in a solid-like form covering the oxide semiconductor layer 11, gate electrodes GE1 and GE2 in island shapes, and an inorganic insulating film 13 in a solid-like form formed of a silicon nitride film are formed in this order on the inorganic insulating film 53. At this time, also in the present embodiment, similarly to the process illustrated in (c) of FIG. 25, in a process for forming the above-described gate electrodes GE1 and GE2 in the island shapes, the gate electrode GE1 in the island shape located above a part of an oxide semiconductor region between the conductive regions 11A and 11E in the oxide semiconductor layer 11 and the gate electrode GE2 in the island shape located above a part of an oxide semiconductor region between the conductive regions 11E and 11B in the oxide semiconductor layer 11 are formed on the inorganic insulating film 12 described above.

Note that, also in the present embodiment, similarly to the seventh embodiment, of the oxide semiconductor region in the oxide semiconductor layer 11, a region that overlaps the gate electrode GE1 functions as the channel region 11C1, and a region that overlaps the gate electrode GE2 functions as the channel region 11C2. Further, the oxide semiconductor region between the channel region 11C1 and the conductive region 11E functions as the resistive region 11R12, and the oxide semiconductor region between the channel region 11C2 and the conductive region 11E functions as the resistive region 11R13.

Subsequently, also in the present embodiment, as illustrated in (c) of FIG. 28, contact holes CH1 and CH2 that extend through the inorganic insulating films 12 and 13 and reach the conductive regions 11A and 11B are formed with the gate electrodes GE1 and GE2 interposed therebetween.

Next, a metal film (not illustrated) is film-formed and patterned on the inorganic insulating film 13, thereby forming a source electrode SE electrically connected to a part of the conductive region 11A (source region 11S) via the contact hole CH1, and forming a drain electrode DE electrically connected to a part of the conductive region 11B (drain region 11D) via the contact hole CH2, as illustrated in (d) of FIG. 28.

Note that, at this time, also in the present embodiment, even when the contact holes CH1 and CH2 are offset from the conductive regions 11A and 11B as illustrated in (c) of FIG. 28, the source electrode SE and the drain electrode DE are made of metal. Thus, the oxide semiconductor layer 11 directly below the source electrode SE and the drain electrode DE is made conductive and becomes the conductive regions 11A and 11B as illustrated in (d) of FIG. 28. Then, the region of the oxide semiconductor layer 11 between the conductive region 11A described above and the channel region 11C1 overlapping the gate electrode GE1 becomes the resistive region 11R11. Further, the region of the oxide semiconductor layer 11 between the conductive region 11B described above and the channel region 11C2 overlapping the gate electrode GE2 becomes a resistive region 11R14.

In the processes described above, the TFT 10 according to the present embodiment is formed. In addition, although not illustrated in the drawings, a TFT substrate 5 including the TFT 10 described above is formed by forming a flattening film 3 on the inorganic insulating film 13 so as to cover the TFT 10 described above.

Advantageous Effects

The present embodiment can also provide similar advantageous effects to those of the seventh embodiment, and can also provide the following advantageous effects. In other words, also in the present embodiment, the resistive regions 11R12 and 11R13 in the height direction are provided on the step portion of the oxide semiconductor layer 11, and thus a width of the resistive regions 11R12 and 11R13 in the plan view can be shortened. Thus, the present embodiment can achieve space saving of the TFT 10 as compared to the seventh embodiment.

Modified Example 1

Note that, in the present embodiment, the case in which the slit 53a is provided in the inorganic insulating film 53 so as to surround the conductive region 11E in the plan view is described as an example. However, the present embodiment is not limited to this example. The TFT 10 described above may include, for example, a plurality of slits 53a or a plurality of slits 52a and 53a that surround each of the conductive regions 11A, 11E, and 11B. The TFT 10 described above includes at least one slit 53a that surrounds any of the conductive regions 11A, 11E, and 11B, and thus space saving of the TFT 10 can be achieved as described above.

Modified Example 2

In addition, instead of forming the drain electrode DE electrically connected to a part of the conductive region 11B via the contact hole CH2 in the TFT 10 described above, by providing slits 52a and 53a surrounding at least a part of the conductive region 11B and exposing a polysilicon film in which impurities are injected, the polysilicon film in which the impurities are injected can be used as the drain electrode DE.

Supplement

A thin film transistor (TFT 10) according to a first aspect of the disclosure includes: at least one gate electrode (gate electrodes GE, GE1, and GE2); an oxide semiconductor layer 11 located below the at least one gate electrode; at least one gate insulating film (inorganic insulating film 12) provided between the oxide semiconductor layer 11 and the at least one gate electrode; and a source electrode SE and a drain electrode DE separated from each other with the at least one gate electrode interposed between the source electrode SE and the drain electrode DE in a plan view, where at least one of the source electrode SE and the drain electrode DE is provided above the gate insulating film, the oxide semiconductor layer 11 includes an oxide semiconductor region, and a plurality of conductive regions (conductive regions 11A, 11E, and 11B) including a conductive region (conductive region 11A) electrically connected to the source electrode SE and a conductive region (conductive region 11B) electrically connected to the drain electrode DE, and the oxide semiconductor region includes at least one channel region (channel regions 11C, 11C1, and 11C2) overlapping the at least one gate electrode, and at least one resistive region (resistive regions 11R1, 11R2, 11R11, 11R12, 11R13, and 11R14) provided between the at least one channel region and a conductive region adjacent to the channel region, the at least one resistive region having a resistance higher than a resistance of the conductive region.

In the thin film transistor (TFT 10) according to a second aspect of the disclosure in the first aspect described above, the resistive region may be provided between the at least one channel region and a conductive region adjacent to the channel region.

In the thin film transistor (TFT 10) according to a third aspect of the disclosure in the first or second aspect described above, the resistance of the resistive region may be identical to a resistance of the channel region when the thin film transistor is in an off state.

In the thin film transistor (TFT 10) according to a fourth aspect of the disclosure in any of the first to third aspects described above, the gate insulating film may be formed in an island shape, a portion that overlaps the oxide semiconductor layer being smaller than the oxide semiconductor layer 11 and larger than the gate electrode, an interlayer insulating film (inorganic insulating film 13) that contacts a part of the oxide semiconductor layer 11 and is formed of a silicon nitride film may be provided between an electrode (for example, the source electrode SE, or the source electrode SE and the drain electrode DE) provided above the gate insulating film among the source electrode SE and the drain electrode DE, and the gate electrode, a region of the oxide semiconductor layer 11 that contacts the interlayer insulating film, the source electrode SE, and the drain electrode DE may be the conductive region, and a region of the oxide semiconductor layer 11 that contacts the gate insulating film and does not overlap the gate electrode may be the resistive region.

In the thin film transistor (TFT 10) according a fifth aspect of the disclosure in any of the first to third aspects described above, an interlayer insulating film (inorganic insulating film 13) adjacent to the gate electrode and formed of a silicon oxide film may be layered between an electrode (for example, the source electrode SE, or the source electrode SE and the drain electrode DE) provided above the gate insulating film among the source electrode SE and the drain electrode DE, and the gate electrode.

In the thin film transistor (TFT 10) according to a sixth aspect of the disclosure in the fifth aspect described above, the gate insulating film may be formed in alignment with the gate electrode.

In the thin film transistor (TFT 10) according to a seventh aspect of the present disclosure in any of the first to sixth aspects described above, an underlayer (inorganic insulating films 52 and 53) may be provided in a lower layer of the oxide semiconductor layer 11, at least one slit (slits 52a and 53a, or a slit 53a) that surrounds at least a part of at least one conductive region among the plurality of conductive regions may be formed in the underlayer, and at least a part of the at least one conductive region may be provided in the at least one slit.

In the thin film transistor (TFT 10) according to an eighth aspect of the disclosure in the seventh aspect described above, the at least one slit may surround at least a part of at least one of conductive regions among a conductive region 11A electrically connected to the source electrode SE and a conductive region 11B electrically connected to the drain electrode DE in the oxide semiconductor layer 11.

In the thin film transistor (TFT 10) according to a ninth aspect of the disclosure in the seventh or eighth aspect described above, the oxide semiconductor layer 11 may be formed in an island shape covering a part of an opening end face of the at least one slit, and the at least one resistive region may be formed in a portion of the oxide semiconductor layer 11 covering an opening end face of the at least one slit.

In the thin film transistor (TFT 10) according to a tenth aspect of the disclosure in the ninth aspect described above, the resistive region may cover each part of opening end faces facing each other in the at least one slit.

In the thin film transistor (TFT 10) according to an eleventh aspect of the disclosure in any of the first to tenth aspects described above, a plurality of the gate electrodes (gate electrodes GE1 and GE2) may be provided, a plurality of the channel regions (channel regions 11C1 and 11C2) that each overlap the gate electrode may be provided between a conductive region 11A electrically connected to the source electrode SE and a conductive region 11B electrically connected to the drain electrode DE in the oxide semiconductor layer 11, the plurality of conductive regions may include a conductive region 11E provided between the channel regions (channel regions 11C1 and 11C2) adjacent to each other, and the resistive region (resistive regions 11R11, 11R12, 11R13, and 11R14) may be provided between each of the channel regions (channel regions 11C1 and 11C2) and the conductive region (conductive regions 11A, 11E, and 11B) adjacent to each of the channel regions.

In the thin film transistor (TFT 10) according to a twelfth aspect of the disclosure in any of the first to fifth aspects described above, a plurality of the gate electrodes (gate electrodes GE1 and GE2) may be provided, a plurality of the channel regions (channel regions 11C1 and 11C2) that each overlap the gate electrode may be provided between a conductive region 11A electrically connected to the source electrode SE and a conductive region 11B electrically connected to the drain electrode DE in the oxide semiconductor layer 11, the plurality of conductive regions may include a conductive region 11E provided between the channel regions (channel regions 11C1 and 11C2) adjacent to each other, the resistive region (resistive regions 11R11, 11R12, 11R13, and 11R14) may be provided between each of the channel regions (channel regions 11C1 and 11C2) and the conductive region (conductive regions 11A, 11E, and 11B) adjacent to each of the channel regions, an underlayer (inorganic insulating films 52 and 53) may be provided in a lower layer of the oxide semiconductor layer 11, a slit (slits 52a and 53a, or a slit 53a) that surrounds at least a part of a conductive region (conductive regions 11A, 11E, and 11B) provided between the channel regions (channel regions 11C1 and 11C2) of the oxide semiconductor layer 11 adjacent to each other may be formed in a portion of the underlayer between the channel regions of the oxide semiconductor layer 11 adjacent to each other, the resistive region may be formed in a portion of the oxide semiconductor layer 11 covering an opening end face of the slit, and a plurality of the gate electrodes may be electrically connected to each other via an oxide semiconductor layer 11 in the slit.

In the thin film transistor (TFT 10) according to a thirteenth aspect of the disclosure in any of the first to twelfth aspects described above, the source electrode SE and the drain electrode DE may be provided above the gate insulating film.

In the thin film transistor (TFT 10) according to a fourteenth aspect of the disclosure in any of the seventh to tenth and twelfth aspects described above, one of the source electrode SE and the drain electrode DE may be provided above the gate insulating film, and the other of the source electrode SE and the drain electrode DE is made of polysilicon in which impurities are injected, the polysilicon being provided in a lower layer of the oxide semiconductor layer 11.

A display device 40 according to a fifteenth aspect of the disclosure includes the thin film transistor (TFT 10) according to any one of the first to fourteenth aspects described above.

The display device 40 according to a sixteenth aspect of the disclosure in the fifteenth aspect described above may include the thin film transistor (TFT 10) and a thin film transistor (TFT 50) including a channel region 51C formed of a low-temperature polysilicon film in an identical pixel.

A manufacturing method of a thin film transistor (TFT 10) according to a seventeenth aspect of the disclosure including: at least one gate electrode (gate electrodes GE, GE1, and GE2); an oxide semiconductor layer 11 located below the at least one gate electrode; at least one gate insulating film (inorganic insulating film 12) provided between the oxide semiconductor layer 11 and the at least one gate electrode; and a source electrode SE and a drain electrode DE separated from each other with the at least one gate electrode interposed between the source electrode SE and the drain electrode DE in a plan view, at least one of the source electrode SE and the drain electrode DE being provided above the gate insulating film, the oxide semiconductor layer 11 including an oxide semiconductor region, at least one channel region (channel regions 11C, 11C1, and 11C2) overlapping the at least one gate electrode, a plurality of conductive regions (conductive regions 11A, 11E, and 11B) including a conductive region 11A electrically connected to the source electrode SE and a conductive region 11B electrically connected to the drain electrode DE, and at least one resistive region (resistive regions 11R1, 11R2, 11R11, 11R12, 11R13, and 11R14) provided between the at least one channel region and a conductive region adjacent to the channel region, the at least one resistive region having a resistance higher than a resistance of the conductive region is the manufacturing method that includes: forming the oxide semiconductor layer 11; forming the at least one gate insulating film on the oxide semiconductor layer 11; forming the at least one gate electrode GE on the at least one gate insulating film; forming a hydrogen blocking layer (photoresists PR1, PR2, PR3, and PR4) that covers the at least one channel region and the at least one resistive region in the oxide semiconductor layer 11; irradiating the oxide semiconductor layer 11 with hydrogen plasma from above the hydrogen blocking layer, and then removing the hydrogen blocking layer; and forming an interlayer insulating film (inorganic insulating film 13) formed of a silicon oxide film, the interlayer insulating film covering the oxide semiconductor layer 11, the at least one gate insulating film, and the at least one gate electrode GE.

In the manufacturing method of a thin film transistor (TFT 10) according to an eighteenth aspect of the disclosure in the seventeenth aspect described above, the at least one gate insulating film may be formed in an island shape in forming the at least one gate insulating film; forming the hydrogen blocking layer may be performed after forming the at least one gate electrode GE; and the hydrogen blocking layer that covers the at least one gate insulating film and the at least one gate electrode may be formed in forming the hydrogen blocking layer.

In the manufacturing method of a thin film transistor (TFT 10) according to a nineteenth aspect of the disclosure in the eighteenth aspect described above, the at least one gate insulating film may be formed in a size identical to a size of the gate electrode GE in a plan view in forming the at least one gate insulating film.

In the manufacturing method of a thin film transistor (TFT 10) according to a twentieth aspect of the disclosure in the seventeenth aspect described above, forming the hydrogen blocking layer may be performed after forming the oxide semiconductor layer 11 and before forming the at least one gate insulating film.

A manufacturing method of a thin film transistor (TFT 10) according to a twenty-first aspect of the disclosure including: at least one gate electrode (gate electrodes GE, GE1, and GE2); an oxide semiconductor layer 11 located below the at least one gate electrode; at least one gate insulating film (inorganic insulating film 12) provided between the oxide semiconductor layer 11 and the at least one gate electrode; and a source electrode SE and a drain electrode DE separated from each other with the at least one gate electrode interposed between the source electrode SE and the drain electrode DE in a plan view, at least one of the source electrode SE and the drain electrode DE being provided above the gate insulating film, the oxide semiconductor layer 11 including an oxide semiconductor region, at least one channel region (channel regions 11C, 11C1, and 11C2) overlapping the at least one gate electrode, a plurality of conductive regions (conductive regions 11A, 11E, and 11B) including a conductive region 11A electrically connected to the source electrode SE and a conductive region 11B electrically connected to the drain electrode DE, and at least one resistive region (resistive regions 11R1, 11R2, 11R11, 11R12, 11R13, and 11R14) provided between the at least one channel region and a conductive region adjacent to the channel region, the at least one resistive region having a resistance higher than a resistance of the conductive region is the manufacturing method that includes: forming the oxide semiconductor layer 11; forming the at least one gate insulating film in an island shape on the oxide semiconductor layer 11, a portion of the at least one gate insulating film that overlaps the oxide semiconductor layer being smaller than the oxide semiconductor layer 11 and larger than the gate electrode GE; forming the at least one gate electrode GE on the at least one gate insulating film; and forming an interlayer insulating film (inorganic insulating film 13) formed of a silicon nitride film, the interlayer insulating film covering the oxide semiconductor layer 11, the at least one gate insulating film, and the at least one gate electrode GE.

The manufacturing method of a thin film transistor (TFT 10) according to a twenty-second aspect of the disclosure in any of the seventeenth to twenty-first aspects described above may further include: forming an underlayer (inorganic insulating films 52 and 53) provided with at least one slit (slits 52a and 53a, or a slit 53a) before forming the oxide semiconductor layer 11, the at least one slit surrounding at least a part of a region that becomes at least one conductive region among the plurality of conductive regions in the oxide semiconductor layer 11; and the oxide semiconductor layer 11 may be formed in an island shape covering a part of an opening end face of the at least one slit in forming the oxide semiconductor layer 11.

The disclosure is not limited to each of the embodiments described above, and various modifications may be made within the scope of the claims. Embodiments obtained by appropriately combining technical approaches disclosed in each of the different embodiments also fall within the technical scope of the disclosure. Moreover, novel technical features can be formed by combining the technical approaches disclosed in the embodiments.

The invention claimed is:

1. A thin film transistor comprising:
at least one gate electrode;
an oxide semiconductor layer located below the at least one gate electrode;
at least one gate insulating film provided between the oxide semiconductor layer and the at least one gate electrode; and
a source electrode and a drain electrode separated from each other with the at least one gate electrode interposed between the source electrode and the drain electrode in a plan view, wherein:
at least one of the source electrode and the drain electrode is provided above the at least one gate insulating film,
the oxide semiconductor layer includes:
an oxide semiconductor region, and
a plurality of conductive regions including a source conductive region electrically connected to the source electrode and a drain conductive region electrically connected to the drain electrode,
the oxide semiconductor region includes:
at least one channel region overlapping the at least one gate electrode, and
at least one resistive region provided between the at least one channel region and one of the plurality of conductive regions, the at least one resistive region having a resistance higher than a resistance of the one of the plurality of conductive regions,
an underlayer is provided in a lower layer of the oxide semiconductor layer,
at least one slit that surrounds at least a part of at least one conductive region among the plurality of conductive regions is formed in the underlayer, and
at least a part of the at least one conductive region is provided in the at least one slit.

2. The thin film transistor according to claim 1, wherein:
the at least one resistive region comprises a plurality of resistive regions,
one of the plurality of resistive regions is provided between the at least one channel region and the source conductive region, and
another one of the plurality of resistive regions is provided between the at least one channel region and the drain conductive region, respectively.

3. The thin film transistor according to claim 1,
wherein the resistance of the at least one resistive region is identical to a resistance of the at least one channel region when the thin film transistor is in an off state.

4. The thin film transistor according to claim 1,
wherein the at least one gate insulating film is formed in an island shape, a portion that overlaps the oxide semiconductor layer being smaller than the oxide semiconductor layer and larger than the at least one gate electrode,
an interlayer insulating film that contacts a part of the oxide semiconductor layer and is formed of a silicon nitride film is provided between an electrode provided above the at least one gate insulating film among the source electrode and the drain electrode, and the at least one gate electrode,
a region of the oxide semiconductor layer that contacts the interlayer insulating film, the source electrode, and the drain electrode is one of the source conductive region and the drain conductive region, and
a region of the oxide semiconductor layer that contacts the at least one gate insulating film and does not overlap the at least one gate electrode is the at least one resistive region.

5. The thin film transistor according to claim 1,
wherein an interlayer insulating film adjacent to the at least one gate electrode and formed of a silicon oxide film is layered between an electrode provided above the at least one gate insulating film among the source electrode and the drain electrode, and the at least one gate electrode.

6. The thin film transistor according to claim 5,
wherein the at least one gate insulating film is formed in alignment with the at least one gate electrode.

7. The thin film transistor according to claim 1,
wherein the at least one slit surrounds at least a part of at least one of conductive regions among the source conductive region and the drain conductive region in the oxide semiconductor layer.

8. The thin film transistor according to claim 1,
wherein the oxide semiconductor layer is formed in an island shape covering a part of an opening end face of the at least one slit, and
the at least one resistive region is formed in a portion of the oxide semiconductor layer covering an opening end face of the at least one slit.

9. The thin film transistor according to claim 8,
wherein the at least one resistive region covers each part of opening end faces facing each other in the at least one slit.

10. The thin film transistor according to claim 1,
wherein a plurality of the gate electrodes is provided,
a plurality of the channel regions that each overlaps the at least one gate electrode is provided between the source conductive region and the drain conductive region in the oxide semiconductor layer,
the plurality of conductive regions further includes an intermediate conductive region provided between the channel regions adjacent to each other, and
the at least one resistive region is provided between each of the channel regions and the intermediate conductive region.

11. The thin film transistor according to claim 1,
wherein the source electrode and the drain electrode are provided above the at least one gate insulating film.

12. The thin film transistor according to claim 1, wherein:
one of the source electrode and the drain electrode is provided above the at least one gate insulating film,
the other of the source electrode and the drain electrode is made of polysilicon in which impurities are injected, and
the polysilicon is provided in a lower layer of the oxide semiconductor layer.

13. A display device comprising the thin film transistor according to claim 1.

14. The display device according to claim 13, further comprising:
the thin film transistor and a second thin film transistor including a channel region formed of a low-temperature polysilicon film in an identical pixel.

15. A thin film transistor comprising:
at least one gate electrode;
an oxide semiconductor layer located below the at least one gate electrode;
at least one gate insulating film provided between the oxide semiconductor layer and the at least one gate electrode; and
a source electrode and a drain electrode separated from each other with the at least one gate electrode interposed between the source electrode and the drain electrode in a plan view, wherein:
at least one of the source electrode and the drain electrode is provided above the at least one gate insulating film,
the oxide semiconductor layer includes
an oxide semiconductor region, and
a plurality of conductive regions including a source conductive region electrically connected to the source electrode and a drain conductive region electrically connected to the drain electrode,
the oxide semiconductor region includes
at least one channel region overlapping the at least one gate electrode, and
at least one resistive region provided between the at least one channel region and one of the plurality of conductive regions, the at least one resistive region having a resistance higher than a resistance of the one of the plurality of conductive regions,
a plurality of the gate electrodes is provided,
a plurality of the channel regions that each overlaps the at least one gate electrode is provided between the source conductive region and the drain conductive region in the oxide semiconductor layer,
the plurality of conductive regions further includes an intermediate conductive region provided between the channel regions adjacent to each other,
the at least one resistive region is provided between each of the channel regions and the intermediate conductive region,
an underlayer is provided in a lower layer of the oxide semiconductor layer,
a slit that surrounds the intermediate is formed in a portion of the underlayer between the channel regions of the oxide semiconductor layer adjacent to each other,
the at least one resistive region is formed in a portion of the oxide semiconductor layer covering an opening end face of the slit, and
a plurality of the gate electrodes is electrically connected to each other via an oxide semiconductor layer in the slit.

16. A manufacturing method of a thin film transistor including: at least one gate electrode; an oxide semiconductor layer located below the at least one gate electrode; at least one gate insulating film provided between the oxide semiconductor layer and the at least one gate electrode; and a source electrode and a drain electrode separated from each other with the at least one gate electrode interposed between the source electrode and the drain electrode in a plan view, at least one of the source electrode and the drain electrode being provided above the gate insulating film, the oxide semiconductor layer including an oxide semiconductor region, at least one channel region overlapping the at least one gate electrode, a plurality of conductive regions including a source conductive region electrically connected to the source electrode and a drain conductive region electrically connected to the drain electrode, and at least one resistive region provided between the at least one channel region and one of the plurality of conductive regions, the at least one resistive region having a resistance higher than a resistance of the one of the plurality of conductive regions, the manufacturing method comprising:
forming the oxide semiconductor layer;
forming the at least one gate insulating film on the oxide semiconductor layer;
forming the at least one gate electrode on the at least one gate insulating film;
forming a hydrogen blocking layer that covers the at least one channel region and the at least one resistive region in the oxide semiconductor layer;
irradiating the oxide semiconductor layer with hydrogen plasma from above the hydrogen blocking layer, and then removing the hydrogen blocking layer; and
forming an interlayer insulating film formed of a silicon oxide film, the interlayer insulating film covering the oxide semiconductor layer, the at least one gate insulating film, and the at least one gate electrode.

17. The manufacturing method of a thin film transistor according to claim 16,
wherein the at least one gate insulating film is formed in an island shape in forming the at least one gate insulating film;
forming the hydrogen blocking layer is performed after forming the at least one gate electrode; and
the hydrogen blocking layer that covers the at least one gate insulating film and the at least one gate electrode is formed in forming the hydrogen blocking layer.

18. The manufacturing method of a thin film transistor according to claim 17,
wherein the at least one gate insulating film is formed in a size identical to a size of the at least one gate electrode in a plan view in forming the at least one gate insulating film.

19. The manufacturing method of a thin film transistor according to claim 16,
wherein forming the hydrogen blocking layer is performed after forming the oxide semiconductor layer and before forming the at least one gate insulating film.

20. The manufacturing method of a thin film transistor according to claim 16, further comprising:
forming an underlayer provided with at least one slit before forming the oxide semiconductor layer, the at least one slit surrounding at least a part of a region that becomes at least one conductive region among the plurality of conductive regions in the oxide semiconductor layer, and
wherein the oxide semiconductor layer is formed in an island shape covering a part of an opening end face of the at least one slit in forming the oxide semiconductor layer.

* * * * *